United States Patent [19]

Motoyama et al.

[11] Patent Number: 4,659,999

[45] Date of Patent: Apr. 21, 1987

[54] DIRECT FREQUENCY SYNTHESIZER WHICH IS STEP-WISE VARIABLE AND HAS PHASE CONTINUITY AND PHASE REPRODUCIBILITY WHEN SWITCHING FREQUENCIES

[75] Inventors: Hatsuo Motoyama, Tokyo; Tetsuo Igawa, Atsugi, both of Japan

[73] Assignee: Anritsu Electric Company Limited, Tokyo, Japan

[21] Appl. No.: 664,401

[22] Filed: Oct. 24, 1984

[30] Foreign Application Priority Data

Oct. 31, 1983 [JP] Japan .................................. 58-202676

[51] Int. Cl.$^4$ ......................... H03L 7/00; H03B 21/02
[52] U.S. Cl. .......................................... 331/2; 331/38; 331/49; 375/66
[58] Field of Search ................... 331/2, 37, 38, 46, 49, 331/56, 76, 179; 375/45, 48, 62, 66; 328/14, 18, 62, 137

[56] References Cited

U.S. PATENT DOCUMENTS 3,223,925 12/1965 Florac et al. ..................... 375/66
3,379,992 4/1968 Hoo ................................. 331/38 X
3,444,320 5/1969 Miyagi ............................ 375/48 X
3,735,269 5/1973 Jackson ........................... 328/14

FOREIGN PATENT DOCUMENTS 2607530 1/1977 Fed. Rep. of Germany .
0906390 9/1962 United Kingdom .
1347512 4/1974 United Kingdom .

OTHER PUBLICATIONS

Search Report issued in corresponding British Applications (1,347,512 and 906,390).
"Frequency Synthesis: Techniques and Applications" IEEE Press.

Primary Examiner—Eugene R. LaRoche
Assistant Examiner—Robert J. Pascal
Attorney, Agent, or Firm—Frishauf, Holtz, Goodman & Woodward

[57] ABSTRACT

In a signal generator based on Direct Frequency Synthesis, a first reference frequency generator generates a signal of a reference frequency. A plurality of second reference frequency generators, respectively, generates K signals with different frequencies $A\sin(\omega_1 t+\psi)$, $A\sin(\omega_2 t+\psi)$ ... $A\sin(\omega_K t+\psi)$, which are in phase at time point (t=0), in response to the output signal of the first reference frequency generator. A switching circuit selectively switches the output signals from the plurality of said second reference frequency generators. A timing pulse generator generates timing pulses to operate said switching circuit at time T as given by $|\omega_{i+1}T - \omega_i T| = 2l\pi$ (l:integer) where i=1, 2 ... K-1.

32 Claims, 20 Drawing Figures

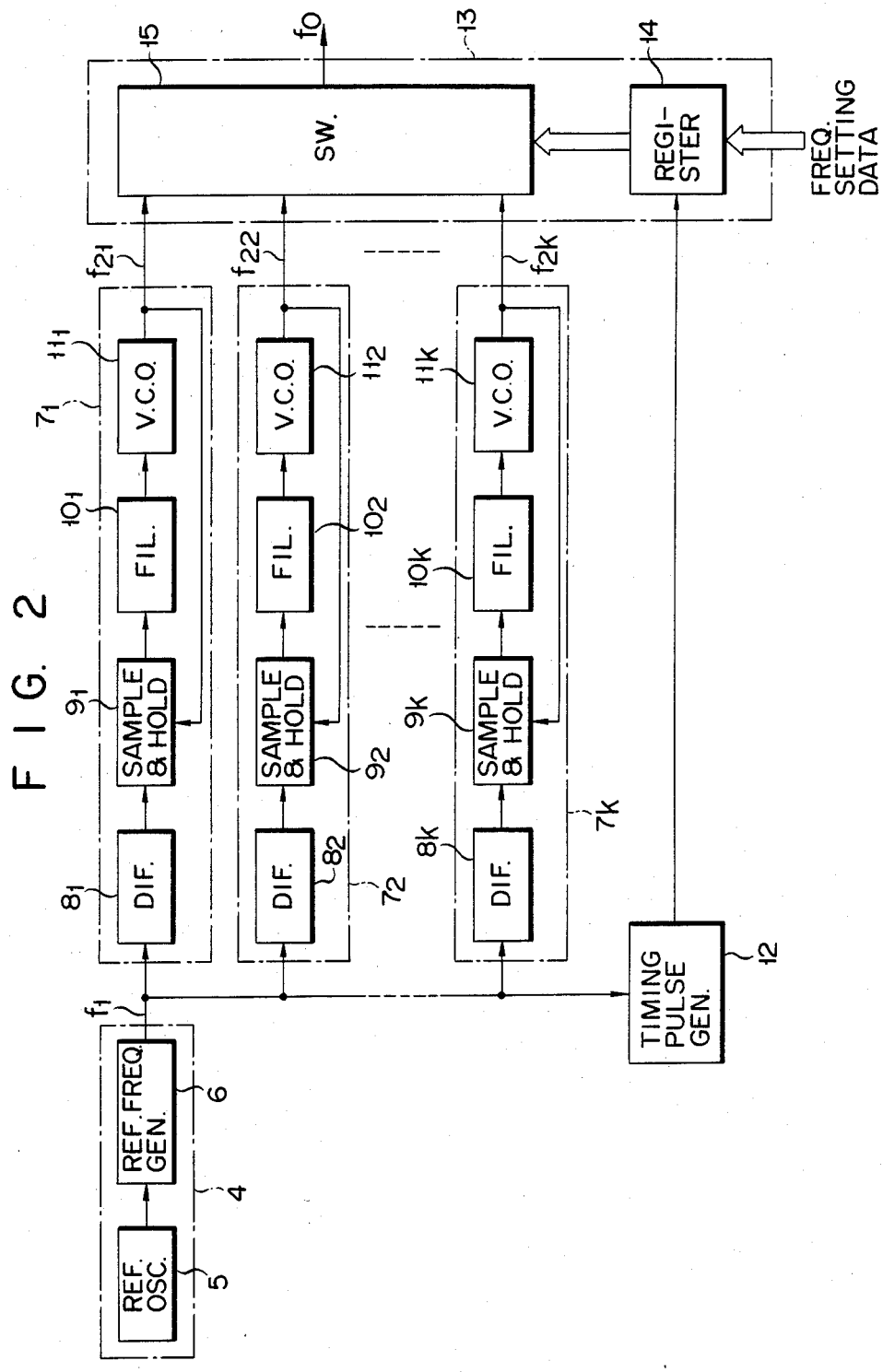

FIG. 3-A
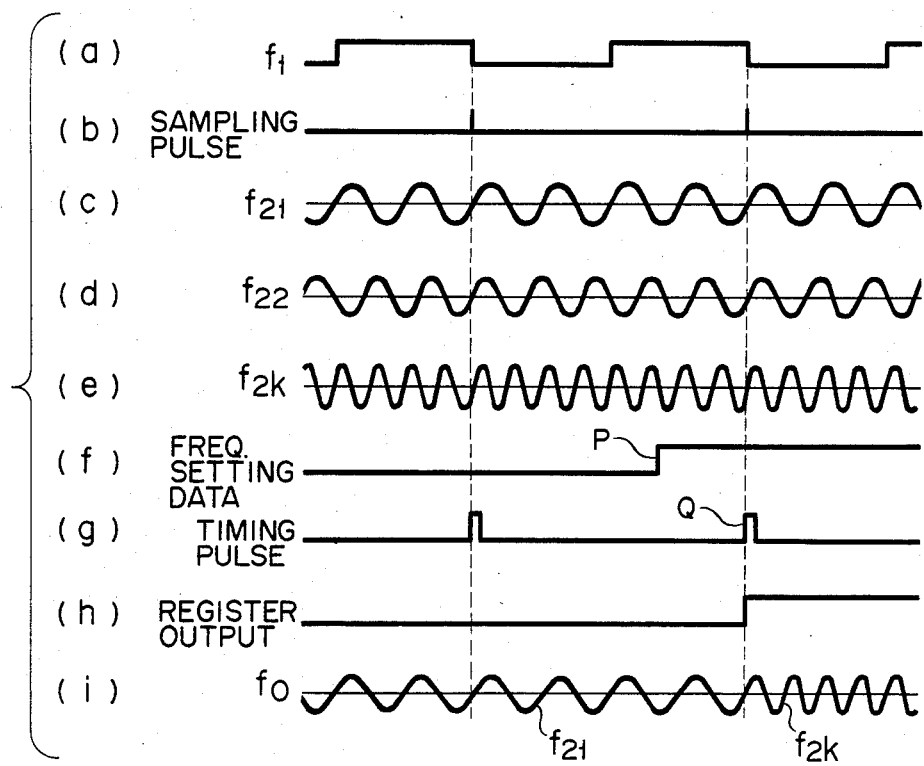
FIG. 3-B
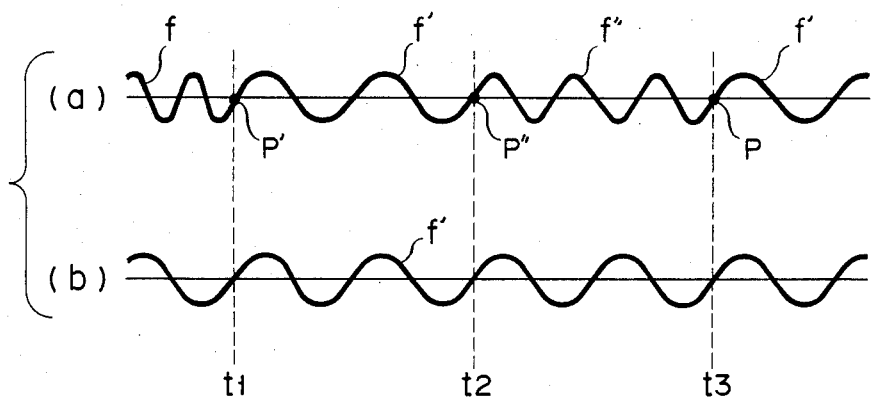

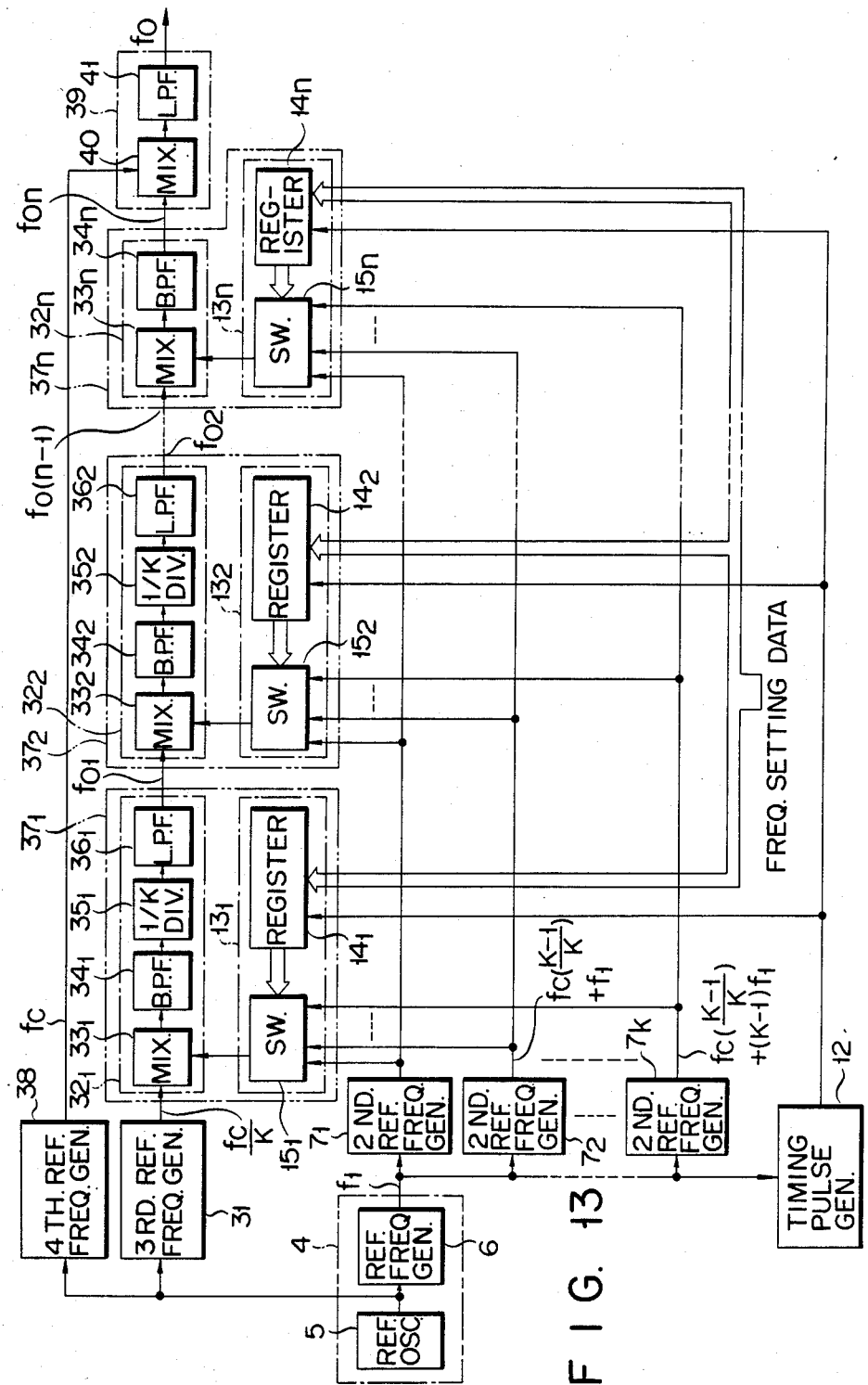
F I G. 13

DIRECT FREQUENCY SYNTHESIZER WHICH IS STEP-WISE VARIABLE AND HAS PHASE CONTINUITY AND PHASE REPRODUCIBILITY WHEN SWITCHING FREQUENCIES

BACKGROUND OF THE INVENTION

This invention relates generally to a signal generator based on the Direct Frequency Synthesis Method, and more particularly to an improved signal generator in which phase control at the time of frequency switching is made easier, to allow the frequency to be switched in a continuous phase.

The Direct Frequency Synthesis Method has been known as one of the basic technologies for frequency synthesis as described in Chapter III of, "Frequency Synthesis: Techniques and Application," edited by Jerzy Gorski-Popiel, staff member of MIT Lincoln Laboratory, and published by The Institute of Electrical and Electronics Engineers, Inc., New York, 1975. The Direct Frequency Synthesis Method has many advantages. For example, when the upper limit frequency is high, signal purity is also high. Also, the frequency can be switched at a high speed. But, this method has also the great disadvantage of having difficult phase control at the time of frequency switching.

FIG. 1 shows a conventional signal generator with a very simple construction which is based on the above method. As shown, a plurality of second reference frequency generators $A_1-A_K$ receives a signal of a first reference frequency $f_1$ and respectively produces signals having a second different reference frequency $f_{21}-f_{2K}$ each of which is a multiple of the first reference frequency $f_1$. A select switch 1 operates in response to an externally applied command requesting a change of the frequency setting data. In operation, the select switch 1 selectively switches the second reference frequencies $f_{21}-f_{2K}$ from one to another according to the command applied. The selected and switched second reference frequency signal is then applied to a mixer 2 where it is mixed with a signal of a third reference frequency $f_3$ as a carrier signal. The output signal of a frequency, as a sum or a difference of the component between those frequencies, is filtered out by a band-pass filter 3.

In the signal generator thus constructed, however, the phases of the second reference frequencies K, $f_{21}-f_{2K}$, are not aligned in phase.

The frequency setting data is changed absolutely independently from the operation of the reference frequency generators. In a digital circuit for transmitting the change of the frequency setting data to the select switch 1, how to speed up the switching operation is the most urgent and serious problem to be solved. Therefore, it is common practice that the digital circuit be designed so as to have a minumum delay time. It is for this reason that the switching timing of the select switch 1 is absolutely independent of the signals generated from the reference frequency generators and is also independent of each of the phases of the second reference frequency signals of K.

With such a design, at the time of frequency switching, there is no continuity between the final phase of a reference frequency before frequency switching and the first phase of another reference frequency after frequency switching. The duration of the phase confusion depends on the phase discontinuity between the reference frequencies causes by frequency switching. The phase confusion is further elongated by the passage of a signal through the band-limiting devices such as the band-pass filter 3 and the succeeding low-pass filter (not shown). As a result, the signal from the signal generator, which has the reference frequency selected anew by the select switch 1, takes a long time to settle down at the final phase after the start of the switching of the select switch 1.

The long confusion of the phase of the output signal of the switched reference frequency is equivalent to a situation when the signal is deeply phase-modulated. Accordingly, a tremendous number of spurious components appear in the form of side bands of the carrier $f_3$ in the output signal until the phase settles down.

As described above, in the conventional signal generator based on the Direct Frequency Synthesis Method, the phase is discontinuous between the reference frequencies at the time of the reference frequency switching, and a great number of spurious components appear for a long period of time. Thus, when the conventional signal generator is applied in a device requiring frequent switching of the frequency, the spurious components can create a serious problem.

The signal generator has been used as a signal source or a local signal generator in a measuring system having a frequency selecting function such as a spectrum analyzer or a network analyzer. In such an application, the spurious components in question provide a major source of measuring errors. In an extreme case, the measurement can not be temporarily conducted. This makes the measuring device unable to perform high speed measuring. In some systems, for example, a satellite communication system, the spurious components make communication impossible. Further, when the signal generator is applied to an exciting oscillator of an elementary particle accelerator, the phase discontinuity occuring in the fine adjustment of the frequency can impair the accelerator or can stop the acceleration of the elementary particles.

In Chapter II, pp. 39 to 44 of the above article, there is described a direct digital synthesizer which could solve the above problem and realize phase continuity of an output signal before and after the switching of a frequency.

In the direct digital synthesizer, phase data is stored in a ROM. The stored phase data is read out by a given clock signal, and is converted into an analog voltage by a D/A converter, thereby obtaining a sinusoidal wave signal of a predetermined frequency. The output frequency is variable by changing the period for reading out the phase data by the clock signal.

In this direct digital synthesizer, the digital processing speed and the number of bits depend on the IC fabrication technique. The present stage of the IC fabrication technology can provide the upper-limit frequency which is much lower than that obtained by the above-mentioned signal generator designed on the basis of the Direct Frequency Synthesis Method. The purity of the signal is also poor.

For the above reasons, there has been a strong demand for the advent of a signal generator based on the Direct Frequency Synthesis Method having a frequency capable of high-speed switching, a signal having a high degree of purity, and a high upper frequency, and which is so improved that phase continuity is secured at the time of frequency switching.

SUMMARY OF THE INVENTION

Accordingly, an object of the present invention is to provide an improved signal generator based on the Direct Frequency Synthesis Method which has an easier phase control at the time of frequency switching and hence can switch frequencies, while keeping phase continuity between the frequencies before and after frequency switching.

Another object of the present invention is to provide a signal generator based on the Direct Frequency Synthesis Method which can provide satisfactory phase reproducibility as well as phase continuity.

In a signal generator based on Direct Frequency Synthesis Method, according to the present invention, a first reference frequency generating means generates a reference frequency signal. A plurality of second reference frequencies generating means generates K signals with different frequencies $A \sin(\omega_1 t+\psi)$, $A \sin(\omega_2 t+\psi)$ ... $A \sin(\omega_K t+\psi)$, which are in phase at time point ($t=0$), in response to the output signal of the first reference frequency generating means. A switching means selectively switches the output signals from the plurality of said second reference frequencies generating means. A timing pulse generating means generates timing pulses to operate said switching means at time T as given by $|\omega_{i+1}T - \omega_i T| = 2 l\pi$ (l: integer) where $i=1, 2 \ldots K-1$.

With such an arrangement, the output signals of the switching means can easily be controlled such that the phases of the signals before and after the frequency switching are continuous so that the problems inevitably involved in the prior art signal generator can completely be solved.

BRIEF DESCRIPTION OF THE DRAWINGS

These and other objects and features of the present invention may be best understood by reference to the specification and the accompanying drawings, in which:

FIG. 2 is a functional diagram illustrating an embodiment of a signal generator according to the present invention;

FIG. 3-A shows a set of waveforms useful in explaining the operation of the circuit of FIG. 2;

FIG. 3-B shows waveforms demonstrating phase reproducibility which will be explained later;

FIGS. 13 and 14 are block diagrams of a modification of the direct frequency synthesizer of FIG. 11;

DETAILED DESCRIPTION OF THE PREFERRED EMBODIMENTS

Figure 1:
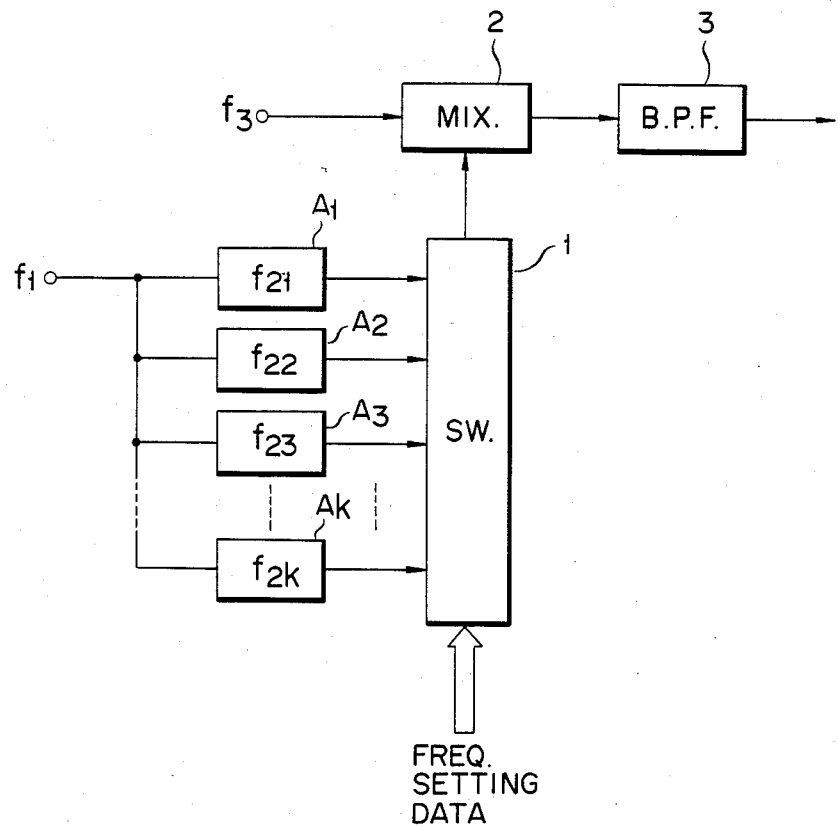
FIG. 1 is a functional diagram illustrating a prior signal generator based on the Direct Frequency Synthesis Method.

Reference is first made to FIG. 2 illustrating a first embodiment of a signal generator which produces a signal of a frequency selected by a frequency switching operation.

In the figure, a first reference frequency generating means 4 is composed of a frequency oscillator 5 such as a highly stable crystal oscillator, and a reference frequency generating circuit 6 which responds to the output signal of the reference oscillator 5 to produce a signal of a first reference frequency $f_1$ which is transmitted to the second reference frequencies generating means $7_1-7_K$. The first reference frequency signal, for example, as a rectangular wave signal also serves as a reference clock signal for aligning in phase the output signals of the second reference frequencies generating means $7_1-7_K$.

The second reference frequencies generating means $7_1-7_K$ respectively generates signals of different frequencies $f_{21}-f_{2K}$ which are aligned in phase according to a predetermined time period T based on the first reference frequency $f_1$. The output signals of the second reference frequencies generating means $7_1-7_K$ have the same phase $\psi$ at time t (t: 0, T, 2T, 3T ... ), and are mathematically expressed by $A \sin(\omega_1 t+\psi)$, $A \sin(\omega_2 t+\psi)$ ... and $A \sin(\omega_K t+\psi)$. In those expressions, where A equals the amplitude and $\omega_{1-K}$ equals the angular frequency:

$$\omega_1 = 2\pi f_{21}, \omega_2 = 2\pi f_{22} \ldots \omega_K = 2\pi f_{2K} \tag{1}$$

The second reference frequencies generating means $7_1-7_K$ may be constructed of a sampling PLL (phase locked loop) circuit, as shown in FIG. 2.

In FIG. 2, differential circuits $8_1-8_K$ produce sampling pulses with a given polarity at the trailing edge of the rectangular wave of the first reference frequency $f_1$ signal. Sample and hold circuits $9_1-9_K$, respectively, sample and hold the output signals from the voltage controlled oscillators $11_1-11_K$, using the sampling pulse from the differential circuits $8_1-8_K$. Loop filters $10_1-10_K$ remove the unnecessary components from the output signals of the sample and hold circuits $9_1-9_K$, thereby determining the characteristics of the PLLs, respectively. The voltage controlled oscillators $11_1-11_K$ respectively produce, in a so-called voltage controlled manner, output signals of predetermined frequencies $f_{21}-f_{2K}$ which are obtained by multiplying the first reference frequency $f_1$ by $N_1$ up to $N_K$ ($N_1$ to $N_K$ are integers), i.e., by $f_1 N_1-f_1 N_K$, on the basis of the output signals from the loop filters $10_1-10_K$.

In the signal generator thus arranged, all the differential circuits $8_1-8_K$ concurrently produce sampling pulses at the trailing edge of the rectangular waveform of the first reference frequency $f_1$. The sample and hold circuits $9_1$–$9_K$ concurrently sample and hold the output signals of the voltage controlled oscillators $11_1$–$11_K$ producing signals of different frequencies. The DC voltage signals from the sample and hold circuits $9_1$–$9_K$, respectively, are applied as control signals to the voltage controlled oscillators $11_1$–$11_K$, via the loop filters $10_1$–$10_K$. The DC voltage signals correspond to the voltages of the signals to be sampled when they are sampled and held. Accordingly, the sampled signals are controlled so as to have the same phase $\psi$ by the outputs of the loop filters $10_1$–$10_K$. Control is performed in such a manner that when the frequencies $f_{21}$–$f_{2K}$ of the output signals of the voltage controlled oscillators $11_1$–$11_K$ are lower than the products $N_1f_1$–$N_Kf_1$, respectively, those frequencies are increased; while when the frequencies are higher than the products, the frequencies are decreased. Through this control process, the output frequencies $f_{21}$–$f_{2K}$ of the voltage controlled oscillators $11_1$–$11_K$ become equal to the products $N_1f_1$–$N_Kf_1$ respectively, and the frequencies $f_{21}$–$f_{2K}$ at the sampling time are all aligned in phase. As described above, the sample and hold circuits $9_1$–$9_K$ respectively serve as phase detectors of 1:N for detecting a phase between two input frequency signals, $f_1$ and any one of the group of $N_1f_1$–$N_Kf_1$, which are in a ratio of one to a multiple of $N_1$–$N_K$. In this way, the second reference frequencies generating means $7_1$–$7_K$ produces signals of the second reference frequencies $f_{21}$–$f_{2K}$ which are different from one another and which have the same phase $\psi$ at predetermined periods based on the reference frequency $f_1$.

A timing pulse generating means 12 receives the first reference frequency $f_1$ and produces, based on the first reference frequency $f_1$, timing pulses which are transferred to a switching means 13 when the second reference frequency signals are aligned in phase. The timing pulse generating means 12 in principle may be constructed of the differential circuit mentioned above.

The period allowing the plurality of reference frequency signals to have the same phase is given by the reciprocal of a frequency as the greatest common denominator (gcd) for each of the different frequency pairs (K−1) of the adjacent frequencies $f_{21}$–$f_{2K}$ since an existing offset frequency in the plurality of reference frequency signals can be removed (as will be given later).

Accordingly, it is sufficient that the timing pulse generating means 12 be designed to generate timing pulses when the frequency difference (or its multiple) is reciprocated. This period is given by:

$$T = \frac{l}{|f_{i+1} - f_i|_{gcd}}$$

where T equals the time period, $|f_{i+1} - f_i|_{gcd}$ equals the gcd of each of the pairs (K−1) of the adjacent frequencies of the second reference frequencies $f_{21}$–$f_{2K}$, i equals 1, 2 ... K−1, and where l equals 1, 2 ....

As described above, $f_{21}$–$f_{2K}$ is respectively equal to $N_1f_1$–$N_Kf_1$. Hence, the period T can also be expressed $$T = \frac{l}{|N_{i+1} - N_i|_{gcd} \times f_1}$$

where $|N_{i+1} - N_i|_{gcd}$ is the gcd of the difference between each pair (K−1) of the adjacent values for each of the values $N_1$–$N_K$. When $|N_{i+1} - N_i|_{gcd} = 1$, the period T is:

$$T = l/f_1$$

Since the shortest period is given when l=1, then we have:

$$T = 1/f_1$$

This period is equal to that of the rectangular wave of the first reference frequency. Therefore, in this case, the expected end is attained by generating a timing pulse at the trailing edge of the rectangular wave signal of the first reference frequency $f_1$.

The switching means 13 selects, for the purpose of frequency switching, one of the output signals from the second reference frequencies generating means $7_1$–$7_k$ according to the frequency setting data externally applied. The switching means 13 is comprised of a register 14 and a select switch 15. When the frequency setting data externally applied changes, the register 14 replaces the already stored frequency setting data by the new one at the instant it receives the timing pulse from the timing pulse generating means 12. The select switch 15 responds to the frequency setting data and switches to select one of the output signals of the second reference frequencies generating means of K, $7_1$–$7_K$, according to the frequency setting data set anew in the register 14.

Next, operation of the first embodiment shown in FIG. 2 will be described referring to the timing charts shown in FIG. 3-A.

The first reference frequency generating means 4 produces a signal of the first reference frequency $f_1$ of a rectangular wave (see (a) in FIG. 3-A). All the differential circuits $8_1$–$8_K$ in the second reference frequencies generating means $7_1$–$7_K$ produce respectively sampling pulses at the trailing edge of the rectangular wave $f_1$ ((b) in FIG. 3-A). The second reference frequencies generating means $7_1$–$7_K$ respectively produces second reference frequency signals of a sinusoidal wave having different frequencies. And, (c)–(e) in FIG. 3-A respectively show the waveforms of the signals of the second reference frequencies $f_{21}$, $f_{22}$ and $f_{2K}$ of the second reference frequencies generating means $7_1$–$7_K$. As already described, the second reference frequencies signals $f_{21}$–$f_{2K}$ have the same phases at the time of the sampling, as already mentioned.

As mentioned above, when $T = 1/f_1$, the timing pulse generating means 12 produces the timing pulse at the trailing edge of the rectangular wave of the first frequency $f_1$ (see (g) in FIG. 3-A).

Upon receipt of the timing pulse, the register 14 replaces the frequency setting data stored therein by the new one when the frequency setting data changes at time point P before the timing pulse is input, as shown by (f) in FIG. 3-A. In other words, even when the frequency data changes at time point P, the register 14 waits until time point Q where the timing pulse reaches the register 14. Then it replaces the frequency setting data thus far stored by the new frequency setting data. The select switch 15 selects one of the output signals of K produced from the second reference frequencies generating means $7_1$–$7_K$ according to the new frequency setting data, and then produces the selected second reference frequency signal.

As described above, in the signal generator as mentioned above, when the frequency setting data is changed, the switching of the reference frequency is made to wait, until next timing of the second reference frequency signals of K are aligned in phase, so that the reference frequency signals before and after the frequency switching are continuous in their phases. For example, (i) in FIG. 3-A shows a waveform of the output signal of the signal generator under discussion when the reference frequency is switched from $f_{21}$ to $f_{2K}$.

As seen from the foregoing description, the signal generator of this embodiment has phase continuity at the time of the switching of the frequency. This embodiment has also the advantage of phase reproducibility as given below.

As shown in (a) of FIG. 3-B, at time $t_1$ the frequency is switched from f to f'; at time $t_2$ it is switched from f' to f''; and at time $t_3$ it is switched from f'' back again to f'. In this case, the phases of the signal of the frequency f', of course, are the same as those which would be obtained if the frequency f' signal continues as it is, as shown in (b) of FIG. 3-B. It is further noted that the phase of the output signal at a phase continuation point P during frequency switching (the initial phase of the output signal at the frequency switching) is the same as those of the other phase continuation points P' and P''. This will be referred to as phase reproducibility. In this respect, the output signal from the switching means 13 in this embodiment has phase reproducibility as well as phase continuity during the switching of the frequency.

In the description of the operation of the signal generator as mentioned above, the delay times of the respective output signals from the second reference frequencies generating means $7_1$–$7_K$ were not considered. In very high frequencies, however, the delay times of the output signals are distinguished and significant. This will be given below referring to FIG. 4.

Figure 4:
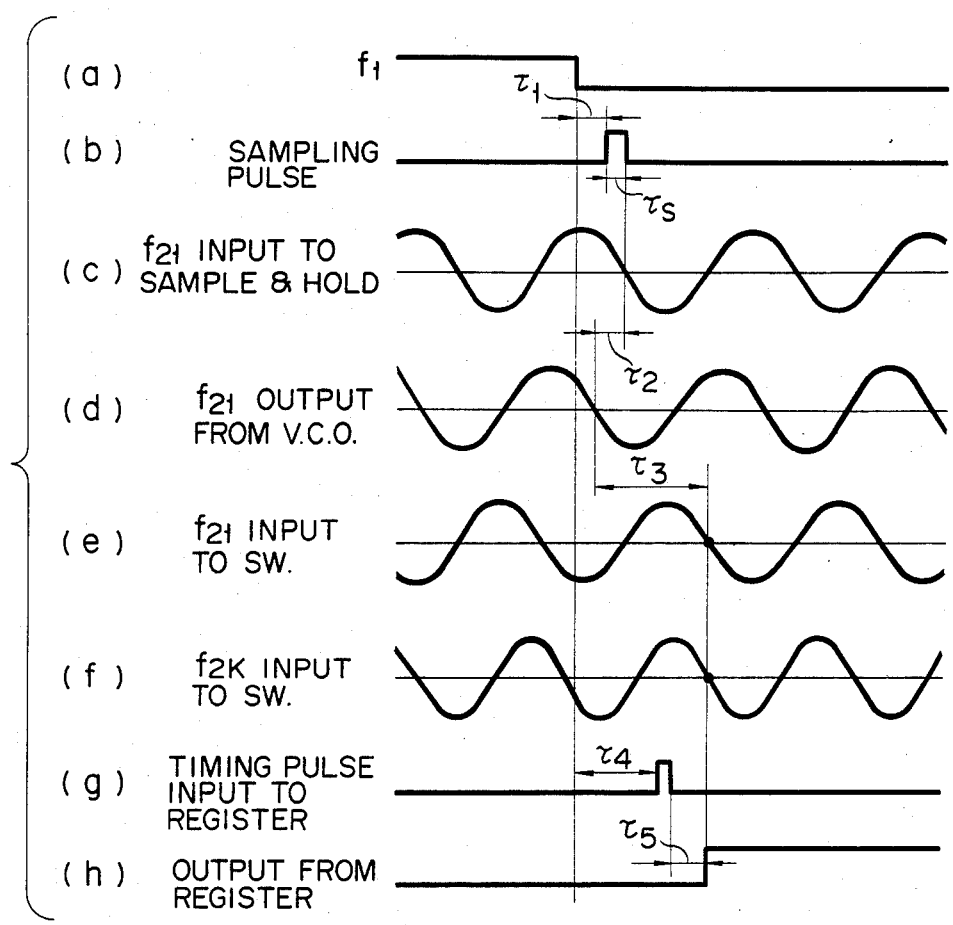
FIG. 4 shows a set of waveforms useful in explaining the operation of the FIG. 2 circuit when the delay times are additionally considered.

In the waveforms of FIG. 4, $\tau_1$ indicates a time between the trailing edge of the rectangular wave signal of the first reference frequency $f_1$ ((a) of FIG. 4) and the instance that the sampling pulse ((b) of FIG. 4) reaches the sample and hold circuits $9_1$–$9_K$. And, $\tau_2$ is time between the outputting of the voltage controlled oscillators $11_1$–$11_K$ and the inputting of the output signal from each of the voltage controlled oscillators $11_1$–$11_K$ to the sample and hold circuits $9_1$–$9_K$. Further, $\tau_S$ is a width of the sampling pulse. With those time lags, the sampled signals (in (c) of FIG. 4, one of them is shown) all have the same phases $\psi$ at the termination of the sampling pulse. The phase $\psi$ can be set at zero or $\pi$ radian by applying a proper preset voltage to the voltage controlled oscillators $11_1$–$11_K$, or by using active filters for the loop filters $10_1$–$10_K$.

The phases of the output signals of the frequencies $f_{21}$–$f_{2K}$ of the voltage controlled oscillators $11_1$–$11_K$ are advanced by time $\tau_2$ before the end of the sampling. The waveform $f_{21}$ shown in (d) of FIG. 4 is one of the output signals $f_{21}$–$f_{2K}$.

The signals output from the voltage controlled oscillators $11_1$–$11_K$ travel and after time $\tau_3$ reach the select switch 15. The two signals of the frequencies $f_{21}$ and $f_{2K}$ are, by way of example, shown in (e) and (f) of FIG. 4, respectively.

There is a time lag $\tau_4$ from the trailing edge of the first reference frequency $f_1$ until the timing pulse of the timing pulse generating means 12 reaches the register 14 (see (g) of FIG. 4). Upon receipt of the timing pulse, the data output from the register 14 reaches the select switch 15 with a time lag $\tau_5$.

An ideal phase continuation is attained when the time point of the outputting of the register 14 (see (h) in FIG. 4) is made substantially coincident with the time point where the second reference frequency signals input to the select switch 15 have the same phases (see (e) and (f) of FIG. 4), allowing for those delay times. This condition for the ideal phase continuation is mathematically expressed by:

$$\tau_1 + \tau_S - \tau_2 + \tau_3 = \tau_4 + \tau_5 \qquad (2)$$

Accordingly, it is preferable to set up the delay times of the related circuit elements so as to satisfy the above equation.

The following will explain how a phase error is caused when the equation (2) above is unsatisfied.

The example to be employed concerns the case where a second reference frequency has been switched from $f_{21}$ to $f_{2K}$. As described above:

$$f_{21} = N_1 \times f_1 \qquad (3)$$

$$f_{2K} = N_K \times f_1 \qquad (4)$$

From the equation (1), the phases $\theta_{21}$ and $\theta_{2K}$ of the frequencies $f_{21}$ and $f_{2K}$ can be written:

$$\theta_{21} = 2\pi f_{21} t + \psi \qquad (5)$$

$$\theta_{2K} = 2\pi f_{2K} t + \psi \qquad (6)$$

The phase difference $\Delta\theta$ between the frequencies $f_{21}$ and $f_{2k}$ is:

$$\Delta\theta = \theta_{2K} - \theta_{21} = 2\pi(f_{2K} - f_{21})t \qquad (7)$$

Substituting the equations (3) and (4) into equation (7), we have:

$$\Delta\theta = 2\pi f_1(N_K - N_1)t \qquad (8)$$

At the sampling point after t=0, i.e., after time $T(T=1/f_1)$, the phase difference $\Delta\theta$ is:

$$\Delta\theta = 2\pi(N_K - N_1) \qquad (9)$$

This indicates that the phase difference $\Delta\theta$ changes by a period corresponding to a difference between the integers ($N_1$ and $N_K$) for the first reference frequency $f_1$ in the frequencies $f_{21}$ and $f_{2K}$. In $T=1/f_1$, also the frequencies $f_{21}$ and $f_{2K}$ are the same phases $\psi$. When the left and right sides of the equation (2) are not equal to each other and there is a time difference $\Delta t$, from the equations (8) and (9), a phase difference $\Delta\theta$ between both the signals $f_{21}$ and $f_{2K}$ is given:

$$\Delta\theta = 2\pi f_1(N_K - N_1)\Delta t \qquad (10)$$

$$= 2\pi(N_K - N_1)\frac{\Delta t}{T}$$

Figure 5:
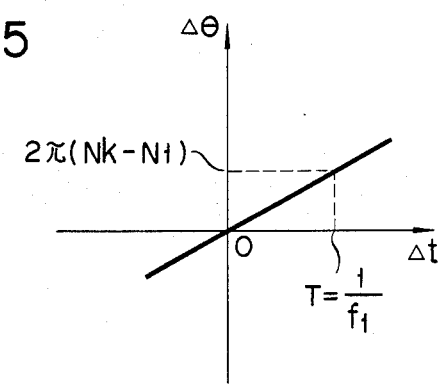
FIG. 5 diagramatically illustrates the relationship between a phase error to a time error.

FIG. 5 shows a graphical representation of the equation (10), that is to say, a variation of a phase difference $\Delta\theta$ against a time difference $\Delta t$ between the outputting time of the register 14 shown in FIG. 4 and the time point where the phases of the signals of $f_{21}$ and $f_{2K}$ are coincident with each other as shown in (e) and (f) of FIG. 4. If $f_1 = 1$ MHz and $N_K - N_1 = 10$:

$$\Delta\theta = 2\pi \cdot 10^7 \cdot \Delta t$$

Accordingly, if $\Delta t = 1$ ns (Schottlky TTL, for example, is used for the digital circuit):

$$\Delta\theta = 2\pi \cdot 10^{-2} \text{ (radian)}$$

Such a phase difference is negligible, and therefore phase continuity is ensured in practical use. If a more precise phase continuity is required, it is sufficient that $\tau_4$, for example, in the equation (2) be selected so that $\Delta t$ is made to approach to zero.

Figure 6:
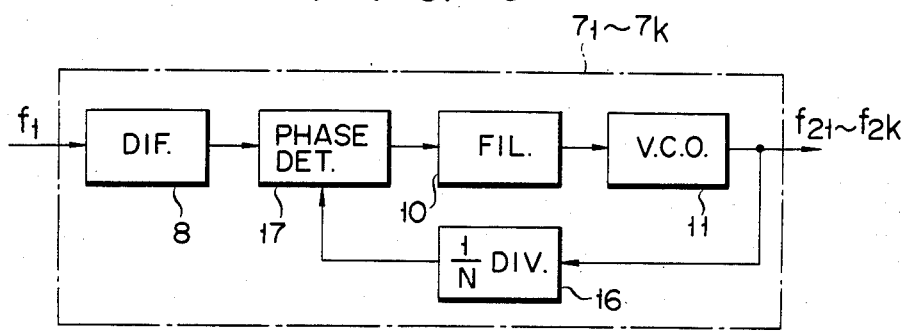
FIGS. 6-8 are block diagrams of other arrangements of the second reference frequency generating means.

In the second reference frequencies generating means $7_1$–$7_K$ shown in FIG. 2, the sample/hold circuit is used for the sampling PLL. The sampling PLL may be replaced by a 1/N PLL constructed of a 1/N frequency divider 16 and a phase detector 17, as shown in FIG. 6.

In the 1/N PLL, the phase detector 17 produces a control voltage so that both inputs from the differential circuit 8 and the 1/N frequency divider 16 are in phase. Each of the second reference frequencies generating means using the 1/N PLL, produces a signal of the second reference frequency N times the first reference frequency. The output signals of different frequencies produced from the second reference frequencies generating means of K thus arranged are aligned in phase, having periods corresponding to the first reference frequency $f_1$, as in the case of FIG. 2, because those outputs are phase-compared by the output signals of the differential circuits $8_1$–$8_K$ on the basis of the first reference frequency $f_1$.

It is preferable to use a circuit with a charge pumping function for the phase detector 17 in order to lessen the phase errors. If necessary, the differential circuit 8 may be omitted.

Figure 7:
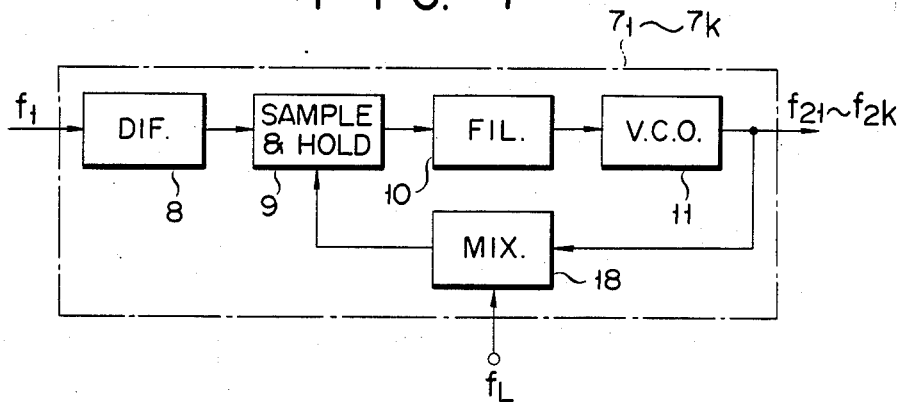
Figure 8:
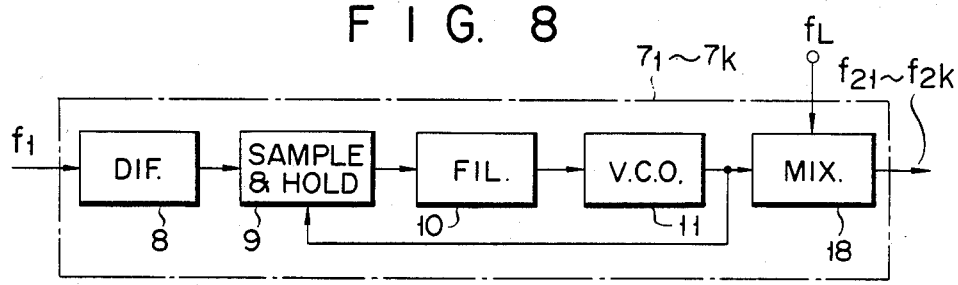

Alternatively, in the second frequencies generating means $7_1$–$7_K$ shown in FIG. 2, a mixer 18 may be used in the PLL or at the output of the voltage controlled oscillator, as shown in FIGS. 7 and 8. These arrangements can also provide the phase-aligned second reference frequencies and cycling at predetermined periods. The mixer 18 is used to simplify the sampling process in the sample/hold circuit 9 and to decrease the integer N of the sampling PLL to substantially reduce the sampling ratio.

The mixer 18 also functions to remove an offset frequency, in addition to reducing the sampling ratio as just mentioned.

Actually, the values of the plurality of the second reference frequencies $f_{21}$–$f_{2K}$ may not necessarily be in whole numbers. If necessary, it may be in the form of decimals. However, if the above-mentioned operation for obtaining the greatest common denominator is applied to second reference frequencies having decimals, the operation is considerably complicated. For avoiding such a complicated operation, the fractions are treated as if they are the offset frequencies, and are removed by the mixer 18.

In this respect, the preferred frequency of an external signal supplied to the mixer 18 must be selected so as to reduce the sampling ratio and to remove the offset frequencies.

Although not shown, a mixer may additionally be used for the FIG. 6 circuit for the same purpose.

In the FIG. 7 circuit, the second reference frequency $f_{21}$ is:

$$f_{21} - f_L = N_1 f_1$$

and $$f_{21} = N_1 f_1 + f_L$$

where $f_L$ is the frequency of the signal externally applied to the mixer 18.

Accordingly, the phases $\theta_{21}$ and $\theta_{2K}$ of the two second reference frequencies, for example, $f_{21}$ and $f_{2K}$, are:

$$\theta_{21} = 2\pi(N_1 f_1 + f_L)t + \psi$$

$$\theta_{2K} = 2\pi(N_K f_1 + f_L)t + \psi$$

From the above equations, the phase difference $\Delta\theta$ between both the phases $\theta_{21}$ and $\theta_{2K}$ is:

$$\Delta\theta = 2\pi f_1(N_K - N_1)t \qquad (11)$$

The equation (11) has no relation to the externally applied frequency $f_L$ and is equal to the equation (8). This implies that the circuit under discussion can provide the second reference frequencies $f_{21}$–$f_{2K}$ of K which have predetermined periods and are phase-aligned with one another.

In the FIG. 8 circuit, the second reference frequency $f_{21}$ is:

$$f_{21} = N_1 f_1 + f_L$$

In this case, we have been also obtained result equal to the equation (11). Therefore, the FIG. 8 circuit can attain the same useful effects as the previous ones.

Figure 9:
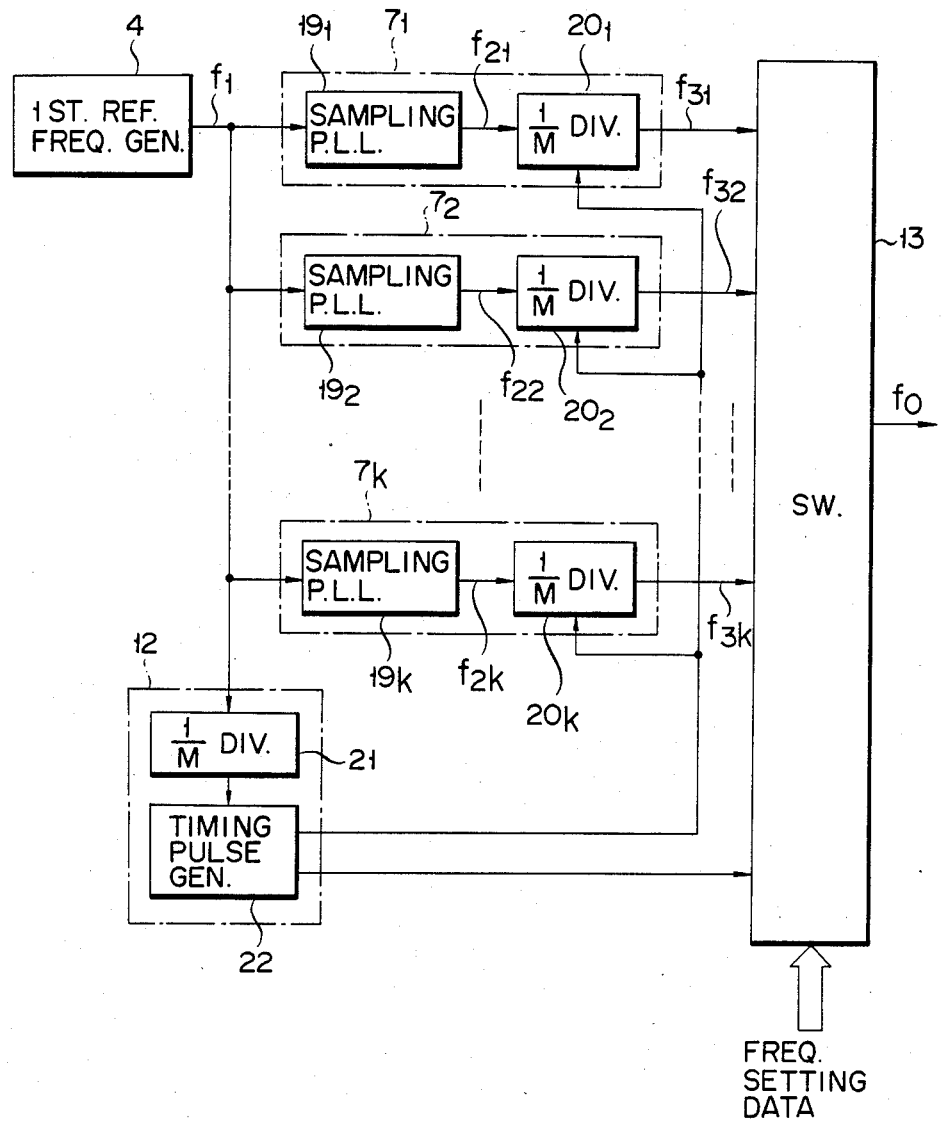
FIGS. 9 and 10 are block diagrams of other embodiments of a signal generator according to the present invention.

Turning now FIG. 9, there is shown a second embodiment of a signal generator according to the present invention. As shown, the signal generator contains 1/M frequency dividers $20_1$–$20_K$ in addition to the sampling PLLs $19_1$–$19_K$ each having the same construction as that of FIG. 2.

The output signals from the sampling PLLs $19_1$–$19_K$ are respectively frequency-divided by the 1/M frequency dividers $20_1$–$20_K$ by a factor of M. The frequency dividers $20_1$–$20_K$ are reset by the output signal from a timing pulse generator 22 to be given later so that the output signals of the frequency dividers are given by:

$$A\sin\left(\frac{\omega_1}{M}t + \frac{\psi}{M}\right), A\sin\left(\frac{\omega_2}{M}t + \frac{\psi}{M}\right)\ldots,$$

$$A\sin\left(\frac{\omega_K}{M}t + \frac{\psi}{M}\right)$$

Therefore, the output signals have the same phase $\psi/M$ at time t (t: 0, MT, 2MT, 3MT . . . ).

In the signal generator thus arranged, the second reference frequencies $f_{31}$–$f_{3K}$ (the output frequencies of the frequency dividers $20_1$–$20_K$) are respectively 1/M of the output frequencies of the sampling PLLs $19_1$–$19_K$. Therefore, the timing pulse generating means 12 is also provided with a 1/M frequency divider 21 having an equal frequency division factor to that of the 1/M frequency dividers $20_1$–$20_K$, thereby having the period of the timing pulse M times that of the FIG. 2 circuit.

The frequency dividers $20_1$–$20_K$ in the second reference frequency generating means $7_1$–$7_K$ are of the conventional high-speed digital IC. The 1/M frequency dividers $20_1$–$20_K$ start each counting operation for the frequency division at a specified time point (as indicated by black dots in (e) and (f) of FIG. 4) when the output signals from the sampling PLLs $19_1$–$19_K$ are phase-aligned with one another.

The timing pulse generating circuit 22 applies a reset pulse (or load pulse) simultaneously to all the 1/M frequency dividers $20_1$–$20_K$ to set predetermined value (for example, zero) in the 1/M frequency dividers $20_1$–$20_K$.

Assuming now that one of the 1/M frequency dividers $20_1$–$20_K$ is denoted as $20_u$ and the output frequency thereof is $f_{3u}$, the phase of the signal of the frequency $f_{3u}$ is:

$$\theta_{3u} = 2\pi f_{3u} t + 2\pi \frac{V}{M} \qquad (12)$$

$$= 2\pi \frac{f_{2u}}{M} t + 2\pi \frac{V}{M}$$

where v: 0, 1, 2 ... M−1, and $f_{2u}$ is the frequency corresponding to $f_{3u}$ of the output frequencies $f_{21}$–$f_{2K}$ from the sampling PLLs $19_1$–$19_K$.

It is assumed that a reset pulse or a load pulse is applied from the timing pulse generating circuit 22 to the 1/M frequency dividers $20_1$–$20_K$ so that those frequency dividers have the same data at time t=0. The equation (12) shows that the v is invariable against all of the u's. Therefore, the phases $\theta_{31}$–$\theta_{3K}$ of the second reference frequencies $f_{31}$–$f_{3K}$ are each equal to $2\pi(V/M)$, and those phase differences are all 0 radian when t=0. The reset pulse is used for initializing the 1/M frequency dividers $20_1$–$20_K$. Accordingly, it is sufficient that it is generated at least one time when the power is on.

Let us assume that time point t' follows time point t=0, and that the output signals of the frequencies $f_{31}$–$f_{3K}$, output from the 1/M frequency dividers of K, $20_1$–$20_K$, are again in phase.

As indicated by the equation (12), the v has a fixed value against all of the u's. Therefore, the phase difference $\Delta\theta^{uw}$ between the frequencies $f_{3u}$ and $f_{3w}$ of those frequencies $f_{31}$–$f_{3K}$ output from the 1/M frequency dividers $20_1$–$20_K$ is:

$$\Delta\theta_{uw} = 2\pi \frac{1}{M} (f_{2w} - f_{2u})t$$

and put:

$$f_{2u} = N_u f_1 \text{ and } f_{2w} = N_w f_1$$

Substituting those frequency values into the above equation, we have the following equation (13):

$$\Delta\theta_{uw} = 2\pi \frac{f_1}{M} (N_w - N_u)t \qquad (13)$$

In the above equation, let the phase difference $\Delta\theta_{uw}$ be $2\pi$, then we obtain:

$$t = \frac{M}{f_1(N_w - N_u)} \qquad (14)$$

The t' to be obtained is a maximum of t of the equation (14).

Generally, the greatest common denominator of the difference between Nu and Nw (the gcd of the differences of all combinations of $N_1$–$N_K$) is 1. Accordingly:

$$t' = M/f_1 \qquad (15)$$

The phases of the output signals of the 1/M frequency dividers $20_1$–$20_K$ are phase-aligned at the period M times that of the FIG. 2 circuit.

The gcd may take a value other than 1, and its value $N_M$ is:

$$t' = M/f_1 N_M \qquad (16)$$

The timings at the periods as shown in equations (15) and (16) can easily be formed using the frequency $f_1$ produced by the reference frequency generating means 4 by the timing pulse generating means 12. Specifically, the output of the 1/M frequency divider 21 provides the timing of $M/f_1$. The frequency division of $N_M/M$ in place of the 1/M provides the timing of $M/f_1 N_M$.

By inputting the timing pulse thus formed by the timing pulse generating circuit 22 to the switching means 13, the frequency can be switched to satisfy both phase continuity and phase reproducibility.

The delays of the signals at the related portions have been described referring to FIG. 4. In the circuit of FIG. 9, additional consideration must be taken regarding the delay times of the outputs from the 1/M frequency dividers $20_1$–$20_K$, and the pulse width of the reset pulse or the load pulse derived from the timing pulse generating circuit 22 which is applied to the 1/M frequency dividers $20_1$–$20_K$. Those delay times are adjusted so that the switching timing is made coincident with a time point where the second reference frequencies are aligned in phase, as in the case of FIG. 4. This rule is correspondingly applicable for the embodiments to subsequently be described.

In the second embodiment of FIG. 9, only the output frequencies $f_{31}$–$f_{3K}$ of the 1/M frequency dividers $20_1$–$20_K$ are input to the switching means 13. If necessary, another switching means (not shown) for switching the output frequencies $f_{21}$–$f_{2K}$ of the sampling PLLs $19_1$–$19_K$ may be provided in addition to the switching means 13. The switching means switches the frequencies $f_{21}$–$f_{2K}$ from one to another under control of the timing pulse from the timing pulse generating means 22. The frequency switched and produced by this switching means also has phase continuity and phase reproducibility.

Figure 10:
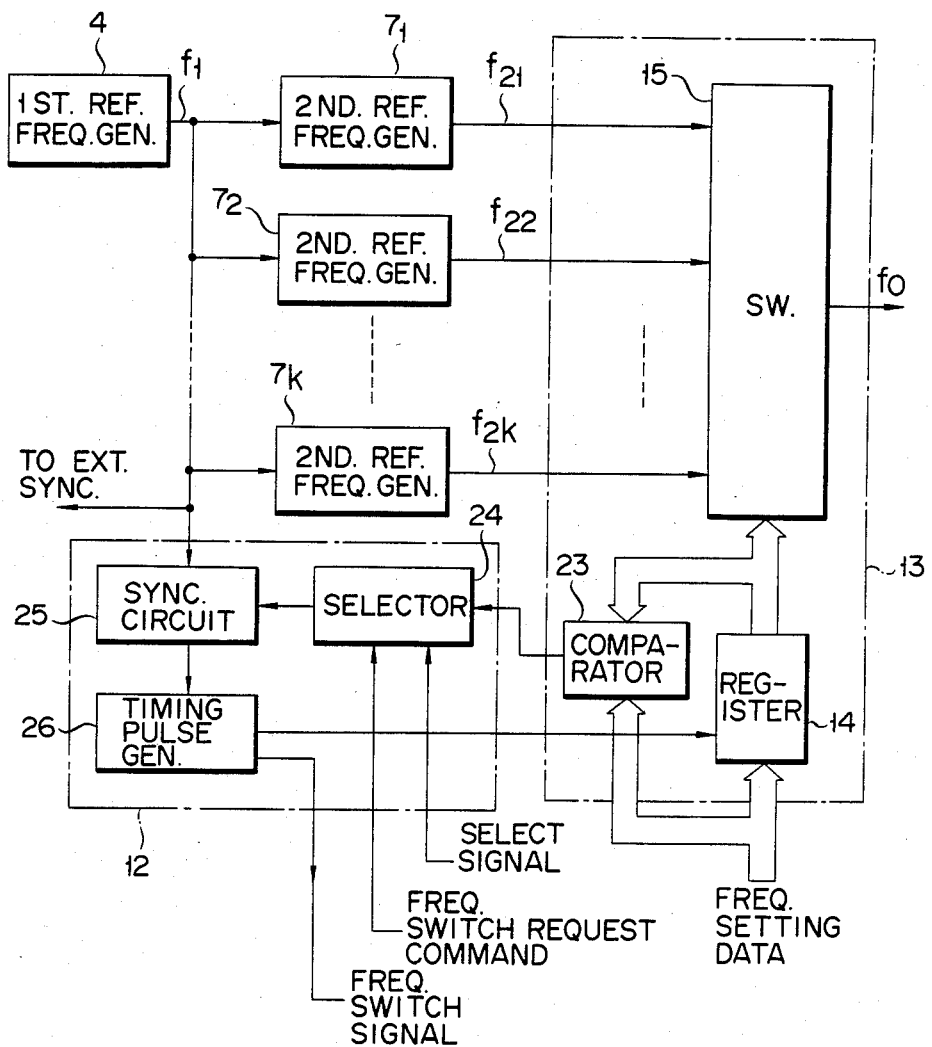

In the first embodiment of FIG. 2, the timing pulse generating means 12 continuously produces timing pulses at predetermined periods irrespective of whether or not the situation needs the switching of frequency. FIG. 10 shows a third embodiment designed for generating timing pulses only when the timing pulse is needed. The embodiment with such a design feature prevents the generation of static noise arising from the continuous generation of timing pulses as in the first embodiment.

In FIG. 10, like symbols are used for designating like or equivalent portions in FIG. 2 for simplicity. As shown, the switching means 13 is additionally provided with a comparator 23. The comparator 23 compares the frequency setting data loaded into the register 14 with the frequency data output from the register 14 into the select switch 15, and produces a noncoincident signal when both the frequencies are not coincident with each other.

The timing pulse generating means 12 is comprised of a selector 24 as a multiplexer, a sync circuit 25, and a timing pulse generating circuit 26. The selector 24 responds to a select signal applied and selects either the noncoincident signal from the comparator 23, or a frequency switch request signal externally applied, and produces a frequency switch command signal. Upon receipt of the frequency switch command signal from the selector 24, the sync circuit 25 produces a one shot pulse in synchronism with the first reference frequency $f_1$. The one shot pulse is then applied to the timing pulse generating circuit 26. The timing pulse generating circuit 26, upon receipt of the one shot pulse, produces timing pulses for replace the data therein with new frequency setting data in the register 14, and further produces a signal for posting to exterior a frequency switching timing. The sync circuit 25 may be constructed of a pulse synchronizer and D flip-flops for controlling the synchronizer, for example.

As shown, the first reference frequency is also output to the exterior for synchronizing purposes.

In the arrangement of FIG. 10, when the frequency setting data is changed, the noncoincident signal from the comparator 23 or the frequency switch request signal externally applied causes the selector 24 to transmit an output signal to the sync circuit 25. Normally, the sync circuit 25 blocks the passage of a rectangular signal of the first reference frequency $f_1$ and allows only one pulse of the rectangular wave signal to pass therethrough when receiving the output signal from the selector 24.

The timing pulse generating circuit 26 produces a timing pulse at the trailing edge of the one shot pulse passed through the sync circuit 25, and applies it to the register 14, thereby causing the register 14 to replace the old frequency setting data with the new one. At the same time, the timing pulse generating circuit 26 produces and applies the signal posting a frequency switching timing to a related external circuit or circuits. As a result of the replacement of the frequency setting data, the select switch 15 operates to select a new second reference frequency.

Thus, in the arrangement of FIG. 10, the timing pulse generating circuit 26 produces only the second pulse as counted from the left in the timing pulse waveform in (g) of FIG. 3-A when the situation needs the switching of frequency.

Figure 11:
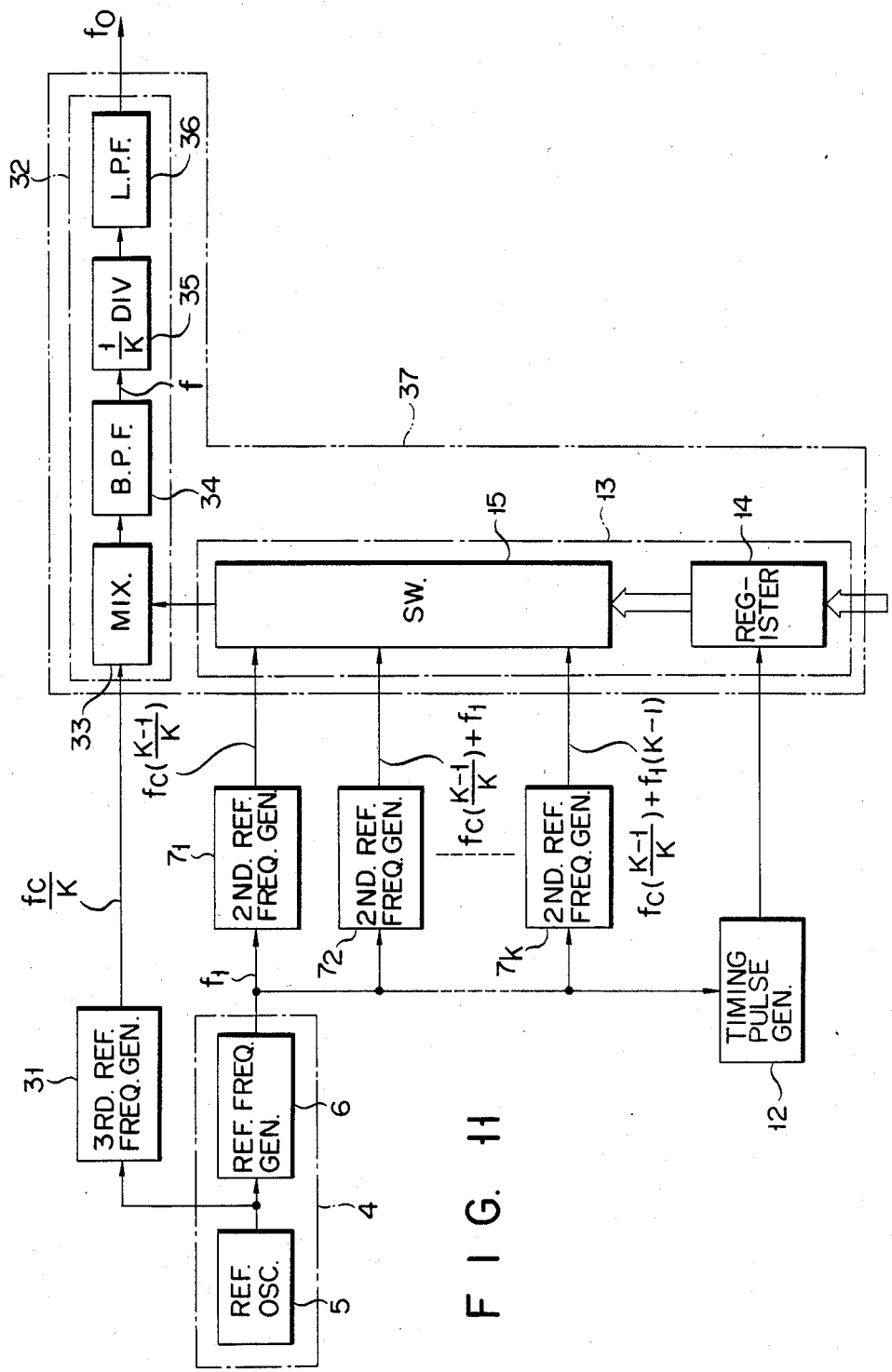
FIG. 11 is a block diagram of a direct frequency synthesizer incorporating the present invention.

FIG. 11 shows a direct frequency synthesizer with phase continuity (only one unit is illustrated) into which the present invention has be incorporated.

In FIG. 11, a third reference frequency generating means 31 receives the output signal from the reference oscillator 5 in the first reference frequency generating means 4 and transfers a third reference frequency to a frequency synthesizing circuit 32. The frequency synthesizing circuit 32 is comprised of a mixer 33, a band-pass filter 34, a 1/K frequency divider 35, and a low-pass filter 36. The mixer 33 mixes the third reference frequency output from the third reference frequency generating means with one of the output signals of the frequencies $f_{21}$–$f_{2K}$ respectively output from the second reference frequencies generating means $7_1$–$7_K$. The band-pass filter 34 selects a sum or a difference frequency from the output signal of the mixer 33. A low-pass filter 35 removes the higher harmonic component from the output signal of the 1/K frequency divider 35. The frequency synthesizing circuit 32 and the switching means 13 make up a frequency synthesizing means 37.

The direct frequency synthesizer shown in FIG. 11 performs the following known operation.

Assume that the third reference frequency from the third reference frequency generating means 31 is $f_c/K$, and that the second reference frequencies $f_{21}$, $f_{22}$, $f_{23}$ .., $f_{2K}$ from the second reference frequencies generating means $7_1$–$7_K$ are respectively:

$$f_c\left(\frac{K-1}{K}\right), f_c\left(\frac{K-1}{K}\right) + f_1, f_c\left(\frac{K-1}{K}\right) + 2f_1, \ldots, f_c\left(\frac{K-1}{K}\right) + (K-1)f_1$$

Then, the band-pass filter 34 produces an output signal of a frequency f as given by:

$$f = \frac{f_c}{K} + f_c\left(\frac{K-1}{K}\right) + (u-1)f_1 \quad (17)$$

$$= f_c + (u-1)f_1$$

where u is 1, 2 ... K. This frequency is frequency divided by the 1/K frequency divider 35 by a factor of K, and the divided frequency is applied to the low-pass filter 36. The output frequency $f_o$ of the low-pass filter 36 is:

$$f_o = \frac{f_c}{K} + \frac{(u-1)}{K} f_1 \quad (18)$$

Assuming that $f_c=45$ MHz, $f_1=0.1$ MHz and $K=10$, then one has:

$$f_o = \frac{45}{10} + \frac{(u-1)}{10} \times 0.1 \text{ (MHz)}$$

This indicates that the output frequency of the low-pass filter 36 is switched or shifted every 0.01 MHz by means of the select switch 15.

As seen from the figure, the second reference frequencies generating means $7_1$–$7_K$, the timing pulse generating means 12 and the switching means 13 have the same arrangements as those of FIG. 2. Therefore, also in this embodiment, phase continuity and phase reproducibility can both be attained to a satisfactory degree when frequency switching is done by the switching means 13.

Assume that the output signal of the third reference frequency generating means 31 is:

$$B \cos\{2\pi(f_c/K)t + \psi_2\} \quad (19)$$

and that the output signal of the select switch 13 is:

$$A \cos[2\pi\{f_c(K-1/K)+(u-1)f_1\}t+\psi_1] \quad (20)$$

where A and B are the amplitude; $\psi_1$ and $\psi_2$ are the phases; and where u is any one of the numerals 1, 2 ... K. The phase of $\theta_t$ of the output signal of the band-pass filter 34, because it is the sum component, is:

$$\theta_t = 2\pi\{f_c + f_1(u-1)\}t + \psi_1 + \psi_2 \quad (21)$$

The signal of the equation (20) has a phase continuity at the time of the frequency switching. The numerical value u is changed only at time $t=0$ or at each time $1/f_1$ (the minimum interval for frequency switching) is distanced from time $t=0$. $\psi_1$ is a fixed value.

In equation (21), the phase $\theta_{l/f_1}$ of the output signal of the band-pass filter 34 at the frequency switching time $t=l/f_1$ (l=0, 1, 2 ... ) is:

$$\theta_{[l/f_1]} = 2\pi\{f_c + f_1(u - 1)\}\frac{l}{f_1} + \psi_1 + \psi_2 \quad (22)$$

$$= 2\pi\left(\frac{f_c}{f_1}\right) l + 2\pi(u - 1)l + \psi_1 + \psi_2$$

In the above equation, $2\pi(u-1)l$ is a multiple of $2\pi$ and hence the phase $\theta_{[l/f_1]}$ at the frequency switching time is:

$$\theta_{[l/f_1]} = 2\pi(f_c/f_1)l + \psi_1 + \psi_2 \quad (23)$$

As shown, the phase $\theta_{[l/f_1]}$ is independent of a value of u. Since $f_c/f_1$ is constant, the output signal of the band-pass filter 34 has phase continuity at the frequency switching time.

Further, in the equation (23), when $f_c$ has an integral value of time $f_1$, $f_c/f_1$ is an integer. Then, in this equation, $2\pi(f_c/f_1)l$ is a multiple of $2\pi$. Accordingly, in this case, the phase $\theta_{[l/f_1]}$ at the frequency switching is:

$$\theta_{[l/f_1]} = \psi_1 + \psi_2 \quad (24)$$

Thus, the two frequency waves are always in phase at the continuation points between these waves, $t=l/f_1$ (l=0, 1, 2 ... ). This implies that the output signal of the band-pass filter 34 has phase reproducibility as well as phase continuity.

When $f_c$ is not a multiple of $f_1$, $2\pi(f_c/f_1)l$ in the equation (23) is not a multiple of $2\pi$. Therefore, the phases of the frequencies before and after the frequency is switched from one to another are always shifted by $\Delta\theta_{[l/f_1]} = 2\pi(f_c/f_1)l$ at the continuation point of the waveforms of these frequencies. Thus, in this case, the output signal of the band-pass filter 34 only has phase continuity, and not have phase reproducibility.

Figure 12:
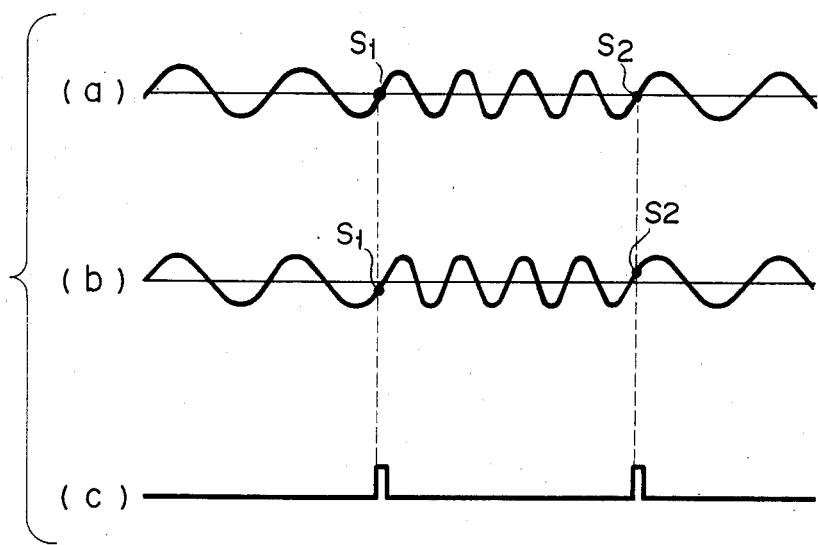
FIG. 12 shows timing charts useful in explaining phase continuity and phase reproducibility, which are observed in the circuit operation of the FIG. 11 circuit.

The waveform shown in (a) of FIGS. 12 is a waveform of the output signal from the band-pass filter 34, in which the waveform contains two frequencies switched at the timing as shown in (c) of FIG. 12. As shown, the phases of those two frequency signals are in the same phase at the waveform coupling points $S_1$ and $S_2$ at the frequency switching time. Thus, the waveform (a) satisfies both phase continuity and phase reproducibility.

FIG. 12 (b) shows a waveform of the signal which is frequency switched at the timing of (c) of FIG. 12 and which only has phase continuity, but does not have phase reproducibility. As shown, the phases of the signals are different from each other at the waveform coupling points $S_1$ and $S_2$ at the frequency switching time.

The output signal of the band-pass filter 34 is frequency divided by the 1/K frequency divider 35 by a factor of K, and then from the relation (21), we see that the phase $\theta'_t$ of the output frequency of the low-pass filter 36 is:

$$\theta'_t = \frac{2\pi}{K} \{f_c + f_1(u - 1)\}t + \frac{\psi_1}{K} + \frac{\psi_2}{K} \quad (25)$$

Accordingly, only when the frequency is switched at the time given by: $t=Kl/f_1$ (where l=0, 1, 2 ... ), the following relation holds:

$$\theta'_{[Kl/f_1]} = 2\pi\left(\frac{f_c}{f_1}\right) l + \frac{\psi_1 + \psi_2}{K}$$

When $f_c/f_1$ is an integer: $\theta'_{[Kl/f_1]} = \psi_1 + \psi_2/K$

These two equations have the same meaning as those of the above equations (23) and (24).

These equations describe that when the output signal of the band-pass filter 34 has both phase continuity and phase reproducibility at the switching time $t=Kl/f_1$, both phase continuity and phase reproducibility are secured in the output signal of the 1/K frequency divider 35. In this case, the timing pulse generating means 12 requires a 1/K frequency divider.

At time $t=l/f_1$ from equation (25), we can see that the phase is shifted by the phase given below:

$$\Delta\theta'_{[l/f_1]} = \frac{2\pi}{K}\left\{\frac{f_c}{f_1} + (u - 1)\right\} l \quad (26)$$

Therefore, at this timing of the frequency switching, phase continuity is secured, but phase reproducibility is not.

FIG. 13 shows a direct frequency synthesizer incorporating the present invention in which a plurality of frequencies synthesizing means is connected in a cascade fashion to allow the frequencies of a plurality of digits to be switched. In FIG. 13, like reference symbols are used to designate like or equivalent portions. Further, suffixes 1, 2 ... n are attached to reference numerals designating a plurality of frequency synthesizing means and the components of which they are made.

As shown, n frequency synthesizing means $37_1$-$37_n$ are connected in a cascade fashion. Those frequency synthesizing means, except for the final stage frequency synthesizing means $37_n$, each have the same circuit construction as that of the frequency synthesizing means in FIG. 11. The final stage frequency synthesizing means $37_n$ is not provided with a 1/K frequency divider and a low-pass filter which are contained in the remaining frequency synthesizing means. The final stage frequency synthesizing means $37_n$ is connected at the output to a frequency converting circuit 39.

A fourth reference frequency generating means 38 receives the output signal from the reference oscillator 5 in the first reference frequency generating means 4, and produces a fourth reference frequency $f_c$ which to be provide the frequency converting circuit 39.

The frequency converting circuit 39 is comprised of a mixer 40 for mixing the output frequency $f_{on}$ of the final stage frequency synthesizing means $37_n$ and the output frequency $f_c$ of the fourth reference frequency generating means 38, and a low-pass filter 41 for picking up the difference frequency between them from the output signal of the mixer 40.

The frequency synthesizing means of FIG. 13, having the cascade connected frequency synthesizing means $37_1$-$37_n$, is respectively provided with 1/K frequency dividers $35_1$-$35_{n-1}$. Therefore, when n=6, K=10, $f_1=0.1$ MHz, and $f_c=45$ MHz, the output frequencies $f_{01}, f_{02} \ldots f_{0(n-1)}$ of the first to (n−1)th stages of the frequency synthesizing means $37_1$-$37_n$ are:

$f_{01}$: 4.50 MHz to 4.59 MHz,
$f_{02}$: 4.500 MHz to 4.599 MHz ...
$f_{0(n-1)}$: 4.500000 MHz to 4.599999 MHz

The output frequency $f_{0n}$ of the final stage frequency synthesizing means $37_n$, because it is not frequency divided by a factor of K, is:

$f_{0n}$: 45.000000 MHz to 45.999999 MHz

Since the output frequency $f_o$ of the frequency converting circuit 39 represents the difference between the fourth reference frequency $f_c$ (45 MHz) from the fourth reference frequency generating means 38 and the output frequency $f_{0n}$:

$f_o$: 0.000000 MHz to 0.999999 MHz, or 0 to 999999 Hz

Therefore, the select switches $15_1$–$15_n$ of the frequency synthesizing means $37_1$–$37_n$ can switch the frequencies in steps 0–9 at the respective places of 1 Hz, 10 Hz . . . 100 KHz.

The operation of the switching means $13_1$–$13_n$, the timing pulse generating means 12, and the second rererence frequencies generating means $7_1$–$7_K$ are the same as those of FIG. 2. Therefore, the frequencies, before and after the frequency switching, are in a phase-continuous state at the time of frequency switching by each of the switching means $13_1$–$13_n$. Accordingly, for the same reason as referred to in the circuit of FIG. 11, the output signal of the frequency $f_{01}$ has phase continuity also at the time of frequency switching by the switch means $13_1$.

Similarly, the output signals of the remaining frequencies $f_{02}, f_{03} \ldots f_n$ have phase continuity when these frequencies are switched. The final output $f_o$ output through the mixer 40 also has phase continuity.

The phase reproducibility of the output frequency $f_{01}$ of the first stage frequency synthesizing means $37_1$ is secured only when $f_c$ is a multiple of $f_1$ and when the switching period of the switching means $13_1$ is $T = Kl/f_1$. Therefore, even if $f_c$ is a multiple of $f_1$, the final output $f_o$ can not have phase reproducibility in any other case than that where 0 is selected at other places than at the final stage select switch $15_n$ (the second reference frequency generating means $7_1$ of those means $7_1$–$7_K$).

Figure 14:
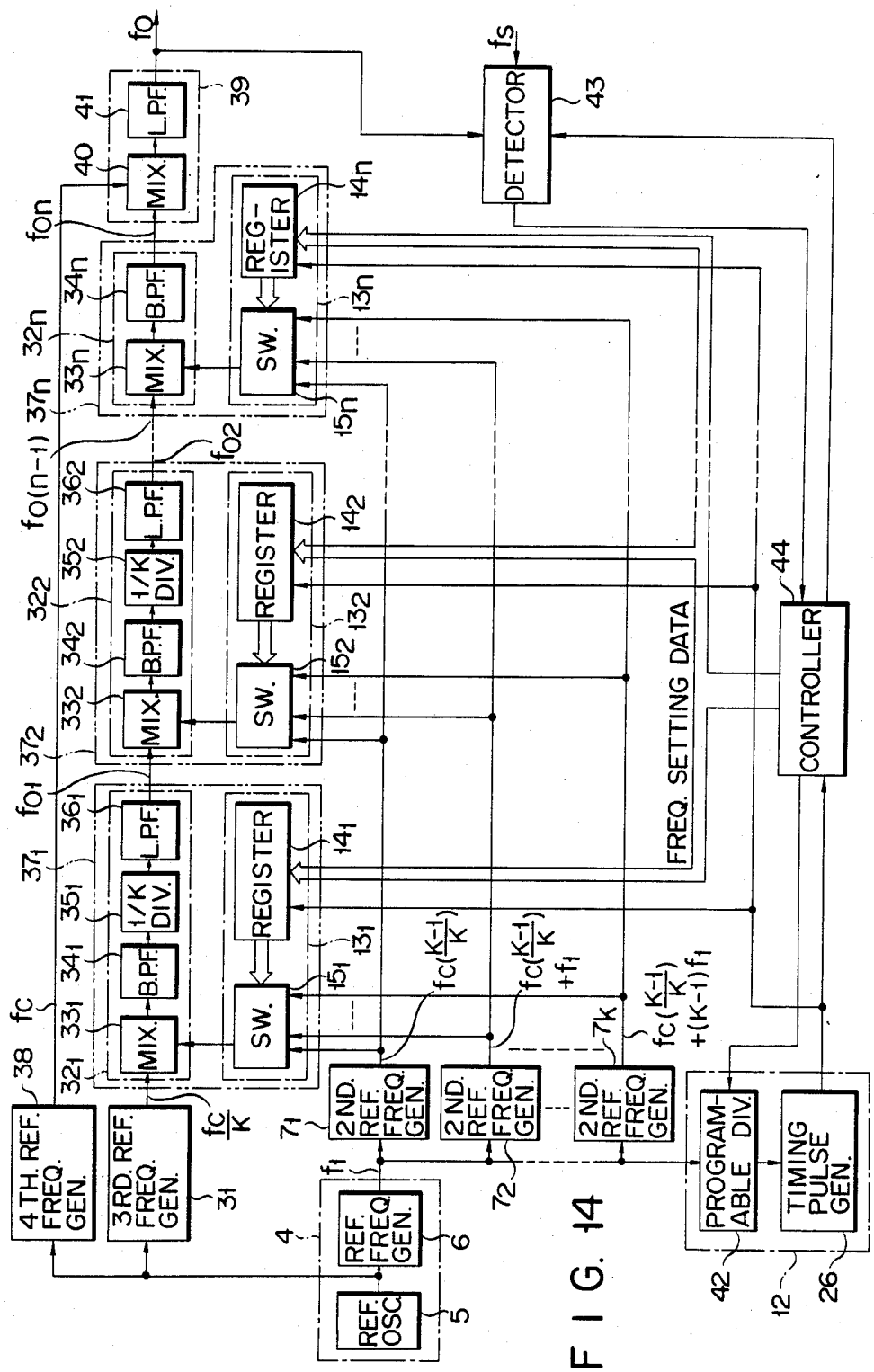

FIG. 14 shows a modification of the direct frequency synthesizer of FIG. 13 with some additional components.

In FIG. 14, a programmable one-to-S (1/S) frequency divider 42 effects frequency division at a frequency division factor S based on the signal from a controller 44.

A detector 43, according to a mode select signal from a controller 44 to be given below, selects either a specific value, e.g. 0 volt, of the output voltage of the frequency converting circuit 39 as the final output of the direct frequency synthesizer or a specific value, e.g., $\pi/2$ radian, of the phase difference between the output frequency $f_o$ and the external reference frequency $f_S$.

The controller 44 applies to the programmable frequency divider 42 a signal for specifying, in a manner to be described, a frequency division factor S of the frequency divider 42 so as to have phase reproducibility for the final output $f_o$ at the time of frequency switching. The controller 44 specifies the operation mode of the phase detector 43. Further, the controller 44 changes the frequency setting data in response to a pulse from the detector 43 and a timing pulse from the timing pulse generating circuit 26.

Assume now that the first reference frequency $f_1$ is 100 KHz, that the second reference frequencies $f_{21}, f_{22} \ldots f_{2K}$ are respectively 40.5 MHz, 40.6 MHz . . . 41.4 MHz, that K is 10, and that the places of the frequency to be switched by the select switches $15_1$–$15_n$ are 1 Hz, 10 Hz . . . 100 KHz.

For setting the output frequency $f_o$ of the frequency converting circuit 39 to be a multiple of 1 KHz, for example, the frequency setting at the 100 Hz, 10 Hz and 1 Hz places are completely zeroed.

Accordingly, the final output frequency $f_o$ is a multiple of 1 KHz. As a result, the output frequency $f_o$ necessarily takes the same phase every 1 ms of the period of 1 KHz. Also, the period T to align the second reference frequencies $f_{21}$–$f_{2K}$ at the same phase is:

$$T = 1/f_1 = 1/(100 \times 10^3) = 10 \ \mu s.$$

Therefore, the period 1 ms of 1 KHz is multiple of T.

The two facts mentioned above imply that in order to switch the output frequency $f_o$ at the units 1 KHz the switching period of 1 ms of 1 KHz enables the signal of the output frequency $f_o$ to also have phase reproducibility. Specifically, since the switching period 1 ms is 100 times that of 10 $\mu s$, the frequency division factor S of the programmable frequency division by is set at 100, thereby effecting the frequency division by a factor of 100. Timing pulses are generated, by the timing pulse generating circuit 26, at periods 100 times the $1/f_1$, period. With the specifications, the output signal $f_o$ has both phase continuity and phase reproducibility. Accordingly, the controller 44 judges the frequency of the units' to be frequency switched on the basis of the frequency setting data applied to the registers $14_1$–$14_n$, calculates a frequency division factor S corresponding to the units' frequency, and then applies the calculated frequency to the programmable frequency divider 42.

Generally, for the stop size frequency $f_p$, the switching period $T_m$ to satisfy the phase reproducibility is:

$$T_m = 1/f_p \tag{27}$$

Let the frequency division factor of the programmable frequency divider 42 be S:

$$T_m = S/f_1 \tag{28}$$

Rearranging the above equations (27) and (28), we have:

$$S = f_1/f_p \tag{29}$$

The controller 44 calculates the equation (29) by applying the units' frequency to be switched to equation (29), and then by controlling the programmable frequency divider 42 with the frequency division factor S calculated. The final output $f_o$ thus produced has both the phase continuity and the phase reproducibility at the frequency switching time.

Figure 15:
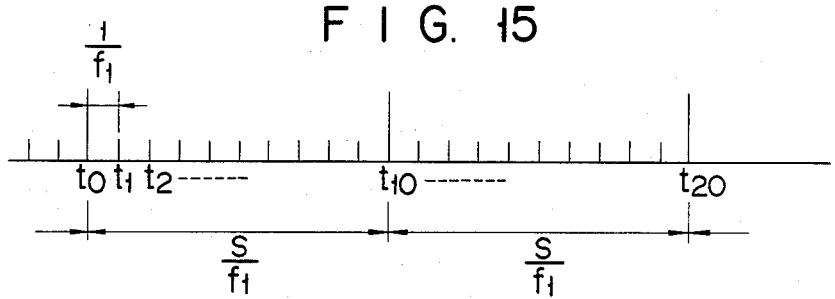
FIG. 15 shows timing pulse generating periods to satisfactorily provide phase continuity and phase reproducibility.

In brief, for securing only phase continuity, the timing pulses are generated at the intervals $1/f_1$ as indicated by the short lines in FIG. 15. For securing both phase continuity and phase reproducibility, the timing pulses are generated at intervals S times the above, as indicated by long lines in FIG. 15.

Thus, the additional use of the controller 44 and the programmable frequency divider 42 realizes the phase reproducibility of the output signal of the frequency converting circuit 39. As shown in (a) of FIG. 3-B, the frequencies have the same phase at all of the phase continuous points. This phase $\psi$ depends on the phase difference between the two input signals (the output signals of the fourth reference frequency generating means 38 and the frequency synthesizing means $37_n$) to the mixer 40. Therefore, the phase continuity point P is shifted from zero radian, as shown in (a) of FIG. 16.

Figure 16:
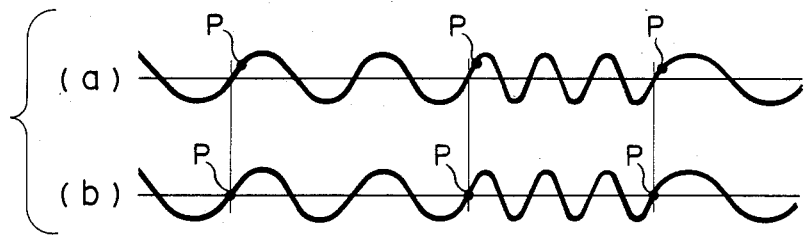
FIG. 16 shows waveforms of two examples of the initial phase of the signal when the frequency is switched.

The shifted phase continuous points P are adjusted to, for example, the zero radian, as shown in (b) of FIG. 16. This adjustment is performed with the following procedure.

To effect the adjustment with only the minimum margin of error, the period of the frequency switching is set at its shortest. For realizing this, the frequency division factor S of the programmable frequency divider 42 is set at 1, and the timing pulses are generated so as to make the frequency switching at the period $T=1/f_1$. Further, the controller 44 sends a select signal to the detector 43 to place it in a mode to detect 0 volt of the output voltage of the frequency converting circuit 39.

Then, the control circuit 44 changes the frequency setting data to 1 Hz, for example. Then, the frequency is switched by the timing pulse, so that the output frequency $f_o$ of the frequency converter 39 is 1 Hz.

Figure 17:
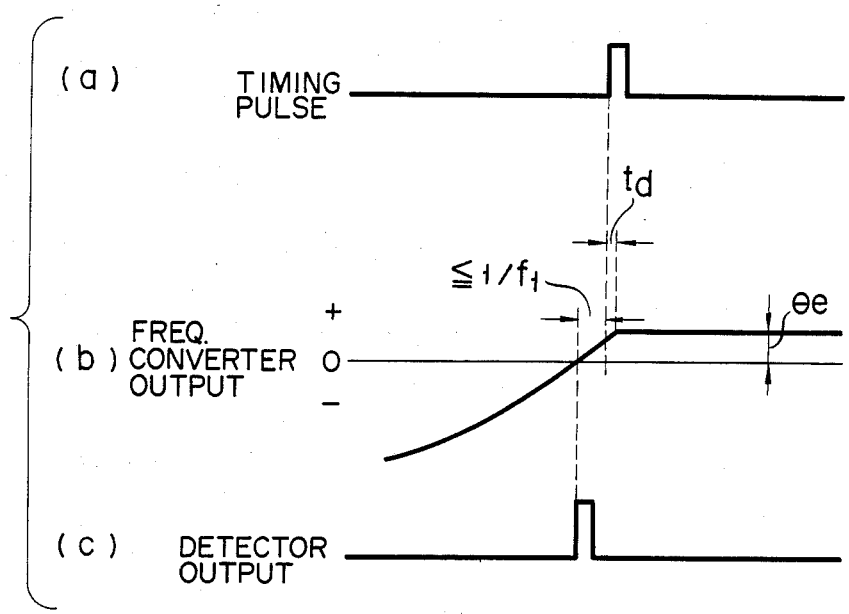
FIG. 17 illustrates timing charts for explaining a control method of the initial phase.

The detector 43 checks the output voltage of the frequency converting circuit 39 and produces a one shot pulse as shown in (c) of FIG. 17 at the instant that the output voltage going from negative to positive crosses 0 volt, as shown in (b) of FIG. 17. Upon receipt of the one shot pulse, the controller 44 changes the frequency setting data to 0 Hz.

Depending on the next timing pulse as shown in (a) of FIG. 17, this frequency setting data of 0 Hz replaces the frequency setting data already set in the register 14. As a result, the output frequency $f_o$ is 0 Hz.

In this way, the adjustment of the phase continuous points P to 0 radian is performed. As seen from FIG. 17, there is a maximum of $1/f_1$ of delay from the instant that the output signal of the frequency converting circuit 39 is 0 volt until the next timing occurs. Further, a delay $t_d$ of about 10 μs is taken from the occurence of the timing pulse until the output of the low-pass filter 41 changes. A maximum of phase difference $\theta_e$ caused by these delays is:

$$\theta_e = 2\pi f_b \left( \frac{1}{f_1} + t_d \right) \tag{30}$$

where $f_b$ is the output frequency of the low-pass filter 41 before the frequency change. Practically, the phase error is:

$$\theta_e = 2\pi \times 1 \times \left( \frac{1}{100 \times 10^3} + 10 \times 10^{-6} \right)$$

$$= 4 \times 10^{-5} \pi \text{ (radian)}$$

This value shows that the phase error is negligibly small.

Now, how to change the adjusted phase at the phase continuous point from the zero radian to a radian having a proper value will be described.

When the frequency $f_b$ is produced for time $t=1/f_1$, a change of the phase $\theta_b$ is:

$$\theta_b = 2\pi f_b \times 1/f_1 \tag{31}$$

By rearranging the equation (31), the frequency $f_b$ required for the necessary phase change $\theta_b$ is:

$$f_b = f_1 \theta_b / 2\pi \tag{32}$$

When $f_1 = 100$ KHz:

$$f_b = 10^5 \theta_b / 2\pi \tag{33}$$

If the step size frequency to be switched is 1 Hz, the phase adjustment is possible at intervals as given by:

$$\Delta \theta_b = 2\pi \times 10^{-5} \text{ (radian)}$$

The phase control for the externally applied reference frequency $f_S$ will be given. Assume that the frequency $f_S$ is in phase with the output frequency of the reference oscillator 5 in the first reference frequency generating means 4.

To start, the controller 44 applies a select signal to the detector 43 to set it in a mode to phase compare the frequency $f_S$ applied to the detector 43 with the output frequency $f_o$ of the frequency converting circuit 39.

If $f_o = f_S$, the operation is substantially equal to that for 0 Hz in the adjustement of the absolute phase of $f_o$.

The operation for generating a signal having the frequency $f_b$ will readily be seen if the frequency setting is for $f_S + f_b$.

In the embodiment of FIG. 14, for changing the phase by a proper amount, for example, $\theta$ radian, with the unit of the frequency to be switched being $f_p$, the timing pulse must be generated at period $T_m$ as given by:

$$\theta_m = 2\pi f_p T_m \tag{34}$$

If the period $T_m$ is a multiple of the minimum period $T = 1/f_1$ satisfying phase continuity, the phase of the output frequencies is continuous at the frequency switching time and the phase changes by $\theta_m$ radian.

By designing the FIG. 14 embodiment such that $\theta_m$ is set at $\pi$ for the frequency setting, an MSK (maximum shift keying) modulation is realized.

Figure 18:
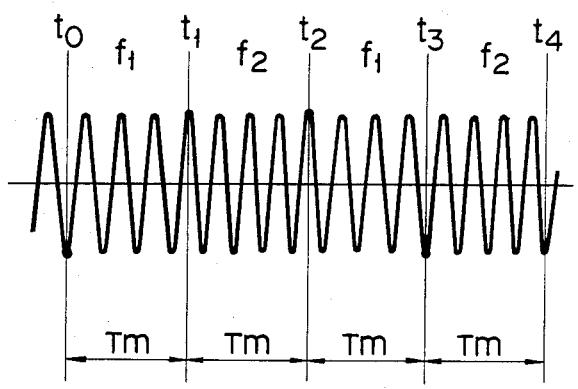
FIG. 18 shows a waveform of an MSK modulated signal.

FIG. 18 shows a modulated waveform obtained when frequencies $f_1$ (7 KHz) and $f_2$ (8 KHz) are MSK modulated. In the figure, the frequency is switched at times $t_0$, $t_1$, $t_2$, etc. At $t_1$ and $t_3$, the phase changes by $\pi$ radian. In this case, the period $T_m$ is 500 μs according to equation (34). From equation (28), the frequency division factor S of the programmable frequency divider 42 is:

$$S = T_m \times f_1 = 500 \times 10^{-6} \times 100 \times 10^3 = 50$$

Figure 19:
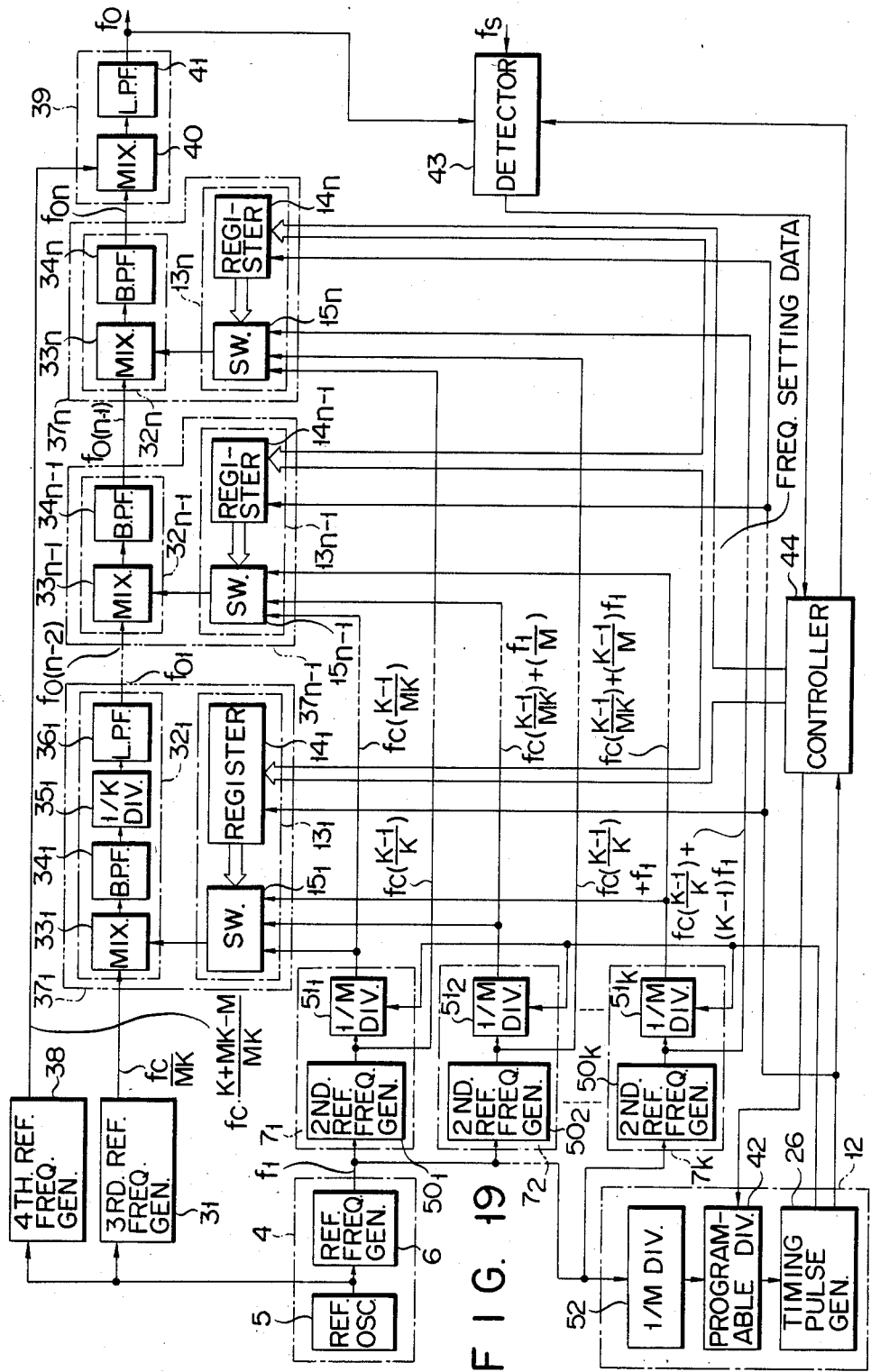
FIG. 19 is a block diagram of a further direct frequency synthesizer according to the present invention.

FIG. 19 shows another direct frequency synthesizer in which the technical idea involved in the FIG. 9 embodiment is applied to the direct frequency synthesizer of FIG. 14.

As shown, the second reference frequencies generating means $7_1$–$7_K$ is respectively provided with sampling PLLs $50_1$–$50_K$ and 1/K frequency dividers $51_1$–$51_K$. Further, the timing pulse generating means 12 is also provided with a 1/K frequency divider 52.

As already stated referring to FIG. 9, the output signals of the sampling PLLs $50_1$–$50_K$ are switched by the final stage select switch $15_n$.

Assume that the output frequency of the third reference frequency generating means 31 is $f_c/MK$, and that the output frequency of the fourth reference frequency generating means 38 is $f_c(K+MK-M)/MK$, then the output frequency $f_o$ of the frequency converting circuit 39 changes at intervals of $f_1/MK^p$ in the following range:

$$f_o: 0 \text{ to } (K-1/M)f_1(M+1+1/K+1/K^2+ \ldots 1/K^p)$$

If $K=M=10$, $p=5$, $f_1=100$ KHz, a direct frequency synthesizer of a decimal having seven digits is realized in which the output frequency $f_o$ changes at intervals of 0.1 Hz in the range of 0–999.9999 Hz.

While some specific embodiments of the present invention have been described, it should be understood that the present invention may variously be changed or modified within the scope of the invention.

The technical ideas shown in FIGS. 6–8 may be applied for the embodiments of FIGS. 9–11, 13, 14 and 19, in addition to the embodiment of FIG. 2.

One or both of the technical ideas in the embodiments of FIGS. 9 and 10 are applicable not only for the FIG. 2 embodiment but also for the embodiments of FIGS. 11, 13, 14 and 19. Further, the technical idea of the FIG. 9 embodiment is applicable for the FIG. 10 embodiment and vice versa.

In the FIG. 11 embodiment, the frequency synthesizing means 37 is composed of the frequency synthesizing circuit 32 and the switching means 13. In the frequency synthesizing means 37, the components constituting the frequency synthesizing circuit 32 are not necessarily the band-pass filter 34, the 1/K frequency divider 35 and the low-pass filter 36, respectively. A combination of any of the components is allowed for the frequency synthesizing circuit 32, if it can take out a frequency synthesized output signal obtained when the output signal of the select switch 15 and the output signal of the third reference frequency generating means 31 are frequency synthesized by the mixer 33 or the like.

When in the embodiments of the frequency synthesizers in FIGS. 13, 14, and 19 the output signals are used for interpolating signals for other high frequency synthesizers, the fourth reference frequency generating means 38 and the frequency converting circuit 39 are omitted using the output of the band-pass filter $34_n$ as the final output of the synthesizer.

As described above, in a signal generator according to the present invention, a plurality of second reference frequency signals output from a plurality of second reference frequencies generating means are phase aligned at a predetermined period. When the frequency setting data is changed, the second reference frequencies are not switched until the plurality of the second reference frequency signals is also phase aligned. Therefore, the reference frequency signals before and after the frequency switching are continuous in phase.

This phase continuity successfully eliminates spurious components which are essentially caused by frequency switching in the conventional signal generator, and of course eliminates the problems resulting from the spurious components. Accordingly, measuring instruments incorporating the signal generator according to the present invention are free from measuring impossible time bands due to the spurious components during high-speed frequency switching, and thereby can perform high-speed measurement. In the field of telecommunications, the device based on the invention is free from various troubles such as being unable to communicate. In the exciting oscillator of an elementary particle accelerator which incorporates the invention, the accelerator is never impaired and a continuous acceleration of it is ensured. Further, a modulated wave of two frequencies having a phase continuity such as an FSK (frequency shift keying) modulation can easily be formed. This is true for the MSK modulation. Further, if the present invention is applied in a medical nuclear magnetic resonance apparatus, for example, NMR-CAT (Computerised Axial Tomography), its performance is remarkably improved because of its excellent phase reproducibility.

As seen from the foregoing description, the present invention realizes phase continuity and phase reproducibility at the time of frequency switching in a signal generator having high-speed frequency switching, a signal having a high amount of purity and a frequency having a high upper limit.

What is claimed is:

1. A direct frequency synthesizer, which is step-wise variable and has phase continuity and phase reproducibility when switching frequencies of an output signal, said direct frequency synthesizer comprising:

first reference frequency generating means for generating a first reference frequency signal;

a plurality of second reference frequency generating means coupled to said first reference frequency generating means for generating a plurality of second reference frequency signals each being a continuous sine wave with a frequency having an integral multiple relationship with said first reference frequency signal but with mutually different frequencies, said plurality of second reference frequency signals having a timing alignment whereby their respective phases are aligned in the same period of said first reference frequency signal;

timing pulse generating means coupled to said first reference frequency signal for generating a timing pulse only when the phases of all of said plurality of second reference frequency signals are substantially equal in said timing alignment;

frequency setting data registration means for receiving said timing pulse and a frequency switch command for renewedly registering frequency data to be set only upon generation of a timing pulse following receipt of said frequency switch command to thereby generate a renewedly registered frequency data signal; and switching means for receiving said plurality of second reference frequency signals and said renewedly registered frequency data signal from said frequency setting data registration means to selectively switch to and output one signal corresponding to said renewedly registered frequency data of said plurality of second reference frequency signals to thereby maintain the phase continuity and phase reproducibility of the output signal before and after switching.

2. A direct frequency synthesizer according to claim 1, in which the plurality of said second reference frequency generating means respectively includes phase-locked loop (PLL) circuits.

3. A direct frequency synthesizer according to claim 2, in which a mixer is provided inside or outside the loop of said PLL circuits, said mixer mixing a signal treated in said loop and an external signal to set up a desired frequency relationship.

4. A direct frequency synthesizer according to claim 1, in which the plurality of said second reference frequency generating means produces second reference frequencies divided by M, said timing pulse generating means produces timing pulses and reset pulses divided by M, and further includes reset means operating to set second reference frequencies in phase at a certain time in response to pulses from said timing pulse generating means.

5. A direct frequency synthesizer according to claim 4, in which the frequency divided signals of said second reference frequency generating means are supplied to said switching means and in which the undivided signals of said second reference frequency generating means are supplied to another switching means.

6. A direct frequency synthesizer according to claim 1, in which said timing pulse generating means generates timing pulses in response to the variation of the frequency setting data.

7. A direct frequency synthesizer according to claim 1, in which said first reference frequency signal generated by said first reference frequency generating means has a rectangular wave.

8. A direct frequency synthesizer according to claim 1, in which the timing pulse is generated by said timing pulse generating means at a predetermined timing set in consideration of the delay times of said respective outputs.

9. A direct frequency synthesizer according to claim 1, further comprising:
third reference frequency generating means for generating a third reference frequency; and
frequency synthesizing means for frequency synthesizing the output signal of said switching means and the output signal of said third reference frequency generating means.

10. A direct frequency synthesizer according to claim 9, further comprising:
detecting means for detecting that the output signal from the final-stage of said frequency synthesizing means takes a predetermined phase; and
a control circuit for producing said predetermined frequency setting data when said control circuit receives phase setting data externally applied and the detecting signal from said detecting means.

11. A direct frequency synthesizer according to claim 10, in which said timing pulse generating means includes a variable frequency divider for dividing, in response to a control signal from said control circuit, the first frequency of the output signal by a division factor corresponding to the unit frequency used to change the final output signal.

12. A direct frequency synthesizer according to claim 10, in which the final-stage frequency synthesizing means includes fourth reference frequency generating means for generating a fourth reference frequency signal phase-locked to the output signal of said first reference frequency generating means, and a mixer for mixing the output signal of the fourth reference frequency generating means and output signals from the 1/k divider or mixer of the final-stage frequency synthesizing means.

13. A direct frequency synthesizer according to claim 10, in which said detecting means detects a predetermined amplitude of the output signal from said frequency synthesizing means or a predetermined phase difference between the output signal and the reference frequency signal externally applied.

14. A direct frequency synthesizer according to claim 10, in which the specific value of the amplitude of the output signal from said frequency synthesizing means, which is detected by said detecting means, is a zero potential point.

15. A direct frequency synthesizer according to claim 9, in which the third reference frequency generated by said third reference frequency generating means is a multiple of said first reference frequency signal.

16. A direct frequency synthesizer according to claim 9, in which the plurality of said second reference frequency generating means respectively include phase-locked loop (PLL) circuits.

17. A direct frequency synthesizer according to claim 16, in which a mixer is provided inside or outside the loop of said PLL circuits, said mixer mixing a signal treated in said loop and an external signal to set up a desired frequency relationship.

18. A direct frequency synthesizer according to claim 9, in which the plurality of said second reference frequency generating means produces second reference frequencies divided by M, said timing pulse generating means produces timing pulses and reset pulses divided by M, and further includes reset means operating to set second reference frequencies in phase at a certain time in response to the pulses from said timing pulse generating means.

19. A direct frequency synthesizer according to claim 18, in which the divided signals of said second reference frequency generating means are supplied to said switching means and in which the undivided signals of said second reference frequency generating means are supplied to another switching means.

20. A direct frequency synthesizer according to claim 9, in which said timing pulse generating means generates timing pulses in response to the variation of the frequency setting data.

21. A direct frequency synthesizer according to claim 9, in which said first reference frequency signal generated by said first reference frequency generating means has a rectangular wave.

22. A direct frequency synthesizer according to claim 9, in which the timing pulse is generated by said timing pulse generating means at a predetermined timing set in consideration of the delay times of said respective outputs.

23. A direct frequency synthesizer according to claim 11, further comprising:
a frequency divider for frequency dividing a mixed signal of the output signal of said switching means and the output signal of said third reference frequency generating means by a factor of k.

24. A direct frequency synthesizer according to claim 23, in which the plurality of said second reference frequency generating means respectively include phase-locked loop (PLL) circuits.

25. A direct frequency synthesizer according to claim 24, in which a mixer is provided inside or outside the loop of said PLL circuits, said mixer mixing a signal treated in said loop and an external signal to set up a desired frequency relationship.

26. A direct frequency synthesizer according to claim 23, in which the plurality of said second reference frequency generating means produces second reference frequencies divided by M, said timing pulse generating means produces timing pulse and reset pulses divided by M, and further include reset means to set second reference frequencies in phase at a certain time in response to the pulses from said timing pulse generating means.

27. A direct frequency synthesizer according to claim 26, in which the divided signals of said second reference frequency generating means are supplied to said switching means and in which the undivided signals of said second reference frequency generating means are supplied to another switching means.

28. A direct frequency synthesizer according to claim 23, in which said timing pulses generating means generates timing pulses in response to the variation of the frequency setting data.

29. A direct frequency synthesizer according to claim 23, in which said first reference frequency signal generated by said first reference frequency generating means has a rectangular wave.

30. A direct frequency synthesizer according to claim 23, in which the timing pulse is generated by said timing pulse generating means at a predetermined timing set in consideration of the delay times of said respective outputs.

31. A direct frequency synthesizer, which is step-wise variable and has phase continuity and phase reproducibility when switching frequencies of an output signal, said direct frequency synthesizer comprising:

first reference frequency generating means for generating a first reference frequency signal;

a plurality of second reference frequency generating means coupled to said first reference frequency generating means for generating a plurality of second reference frequency signals each being a continuous sine wave with a frequency having an integral multiple relationship with said first reference frequency signal but with mutually different frequencies, said plurality of second reference frequency signals having a timing alignment whereby their respective phases are aligned in the same period of said first reference frequency signal;

timing pulse generating means coupled to said first reference frequency signal for generating a timing pulse only when the phases of all of said plurality of second reference frequency signals are substantially equal in said timing alignment;

frequency setting data registration means for receiving said timing pulse and a frequency switch command for renewedly registering frequency data to be set only upon generation of a timing pulse following receipt of said frequency switch command to thereby generate a renewedly registered frequency data signal;

a plurality of frequency synthesizing means connected in a cascade fashion, each of said frequency synthesizing means including switching means for receiving said plurality of second reference frequency signals and said renewedly registered frequency data signal from said frequency setting data registration means to selectively switch to and output one signal corresponding to said renewedly registered frequency data of said plurality of second reference frequency signals to thereby maintain the phase continuity and phase reproducibility of the output signal before and after switching, a mixer for mixing an input signal thereto and the output signal from said switching means, and a frequency divider for frequency dividing the output signal from said mixer into a factor of k; and third reference frequency generating means for generating a third reference frequency signal phase-locked to the output signal of said first reference frequency generating means, and for applying the third reference frequency signal to the first stage of said frequency synthesizing means.

32. A direct frequency synthesizer according to claim 31, in which the final-stage frequency synthesizing means does not include said 1/k divider.

* * * * *